United States Patent
Watahiki et al.

(10) Patent No.: US 11,251,282 B2
(45) Date of Patent: Feb. 15, 2022

(54) POWER SEMICONDUCTOR DEVICE

(71) Applicant: Mitsubishi Electric Corporation, Tokyo (JP)

(72) Inventors: Tatsuro Watahiki, Tokyo (JP); Yohei Yuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/771,691

(22) PCT Filed: Dec. 18, 2018

(86) PCT No.: PCT/JP2018/046578
§ 371 (c)(1),
(2) Date: Jun. 11, 2020

(87) PCT Pub. No.: WO2019/155768
PCT Pub. Date: Aug. 15, 2019

(65) Prior Publication Data
US 2021/0074826 A1   Mar. 11, 2021

(30) Foreign Application Priority Data
Feb. 9, 2018   (JP) .............................. JP2018-022222

(51) Int. Cl.
*H01L 29/47* (2006.01)
*H01L 29/06* (2006.01)
(Continued)

(52) U.S. Cl.
CPC .......... *H01L 29/47* (2013.01); *H01L 29/0619* (2013.01); *H01L 29/0657* (2013.01);
(Continued)

(58) Field of Classification Search
CPC . H01L 29/47; H01L 29/0619; H01L 29/0657; H01L 29/0692; H01L 29/24;
(Continued)

(56) References Cited

U.S. PATENT DOCUMENTS

2006/0084221 A1* 4/2006 Moran ................. H01L 29/417
438/237
2008/0128850 A1 6/2008 Goerlach et al.
(Continued)

FOREIGN PATENT DOCUMENTS

JP   2008-519447 A   6/2008
JP   2013-222798 A   10/2013
(Continued)

OTHER PUBLICATIONS

International Search Report and Written Opinion dated Mar. 5, 2019 for PCT/JP2018/046578 filed on Dec. 18, 2018, 9 pages including English Translation of the International Search Report.

*Primary Examiner* — Shahed Ahmed
(74) *Attorney, Agent, or Firm* — Xsensus LLP

(57) ABSTRACT

In order to provide a power semiconductor device reducing a leakage current due to a defect layer and having a small fluctuation in a threshold voltage, included are an n-type epitaxial film layer formed on a surface of the single crystal n-type semiconductor substrate and having a concave portion and a convex portion; an insulating film formed on a first region in a top portion of the convex portion; a p-type thin film layer formed on a surface of the insulating film and a surface of the n-type epitaxial film layer to form a pn junction between the p-type thin film layer and the n-type epitaxial film layer; and an anode electrode, at least part of which is formed on a surface of the p-type thin film layer and part of which passes through the p-type thin film layer and the insulating film.

14 Claims, 11 Drawing Sheets

(51) Int. Cl.
*H01L 29/24* (2006.01)
*H01L 29/40* (2006.01)
*H01L 29/66* (2006.01)
*H01L 29/872* (2006.01)

(52) U.S. Cl.
CPC .......... *H01L 29/0692* (2013.01); *H01L 29/24* (2013.01); *H01L 29/407* (2013.01); *H01L 29/66212* (2013.01); *H01L 29/872* (2013.01)

(58) Field of Classification Search
CPC ............. H01L 29/407; H01L 29/66212; H01L 29/242; H01L 29/66969; H01L 29/32; H01L 29/0649; H01L 29/872–8725; H01L 2924/12032; H01L 29/66143; H01L 27/0766
See application file for complete search history.

(56) References Cited

U.S. PATENT DOCUMENTS

| | | | |
|---|---|---|---|
| 2011/0215338 | A1 | 9/2011 | Zhang |
| 2012/0056196 | A1* | 3/2012 | Ota ..................... H01L 29/1608 257/77 |
| 2012/0098082 | A1* | 4/2012 | Hsu ....................... H01L 29/872 257/471 |
| 2017/0271148 | A1* | 9/2017 | Takashima ........ H01L 21/02389 |
| 2018/0097123 | A1* | 4/2018 | Kajitani .................. H01L 27/15 |
| 2020/0185541 | A1* | 6/2020 | Yuda .................... H01L 29/7838 |
| 2020/0295203 | A1* | 9/2020 | Watahiki ........... H01L 29/66969 |

FOREIGN PATENT DOCUMENTS

| | | |
|---|---|---|
| JP | 2015-065469 A | 4/2015 |
| WO | 2019/003861 A1 | 1/2019 |

\* cited by examiner

F I G. 3
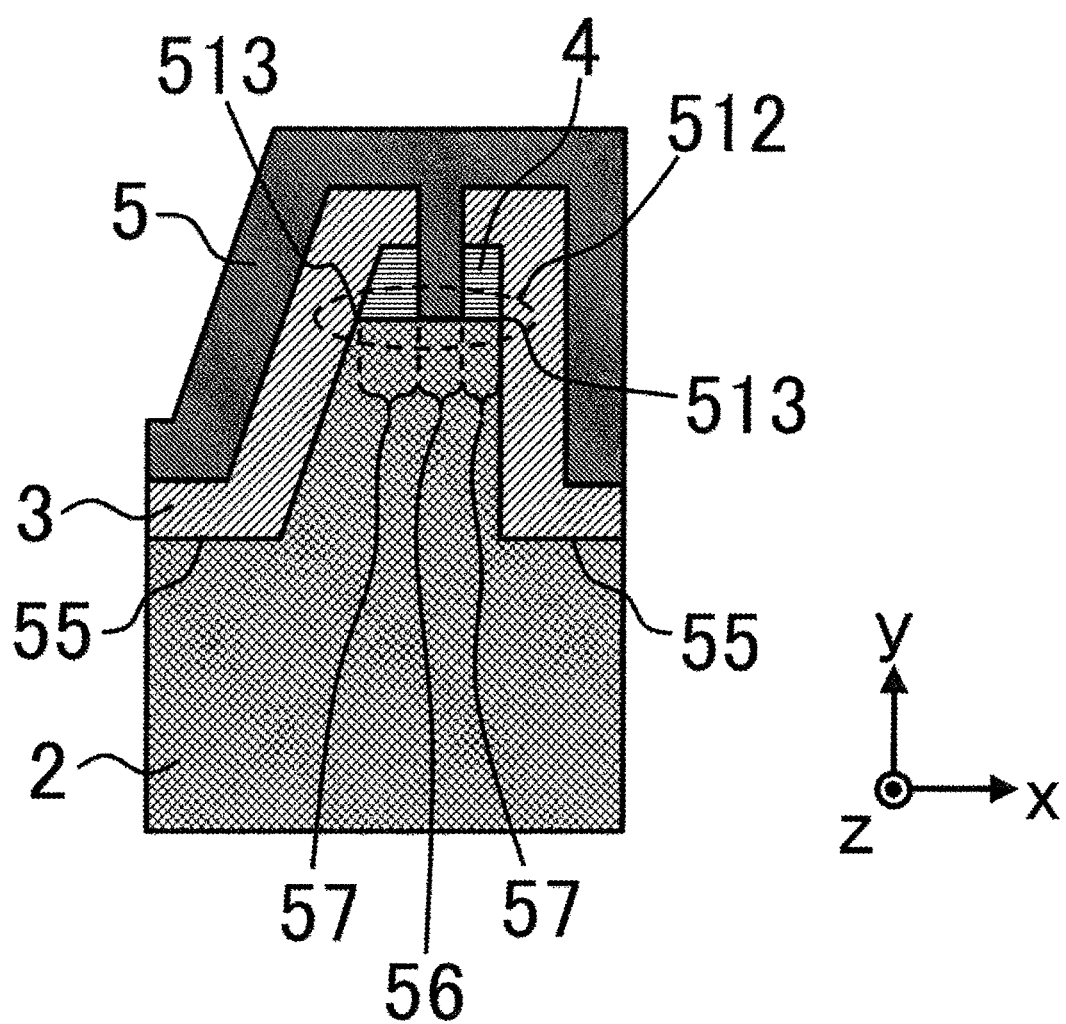

FIG. 6A
FIG. 6B
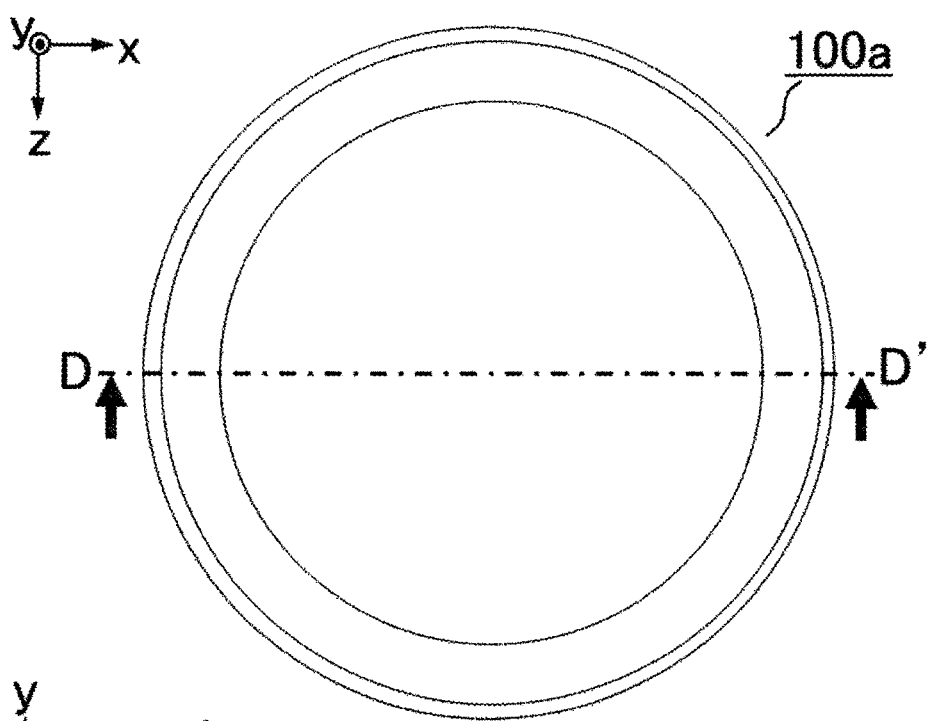
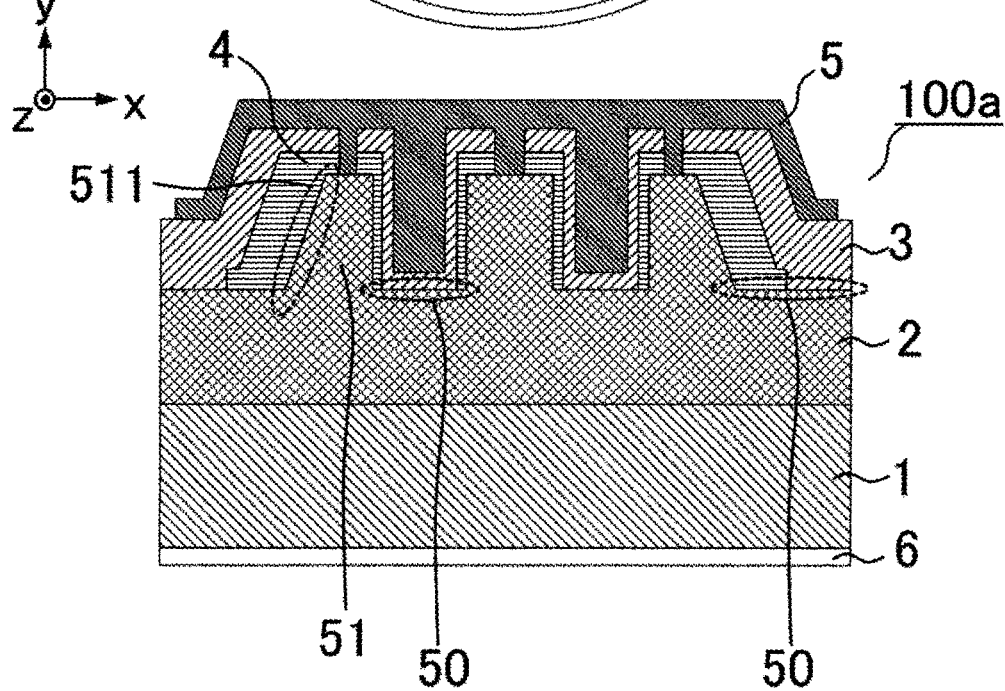

FIG. 11A
FIG. 11B
FIG. 11C
FIG. 11D
FIG. 11E
FIG. 11F
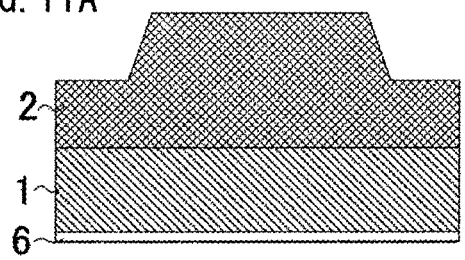
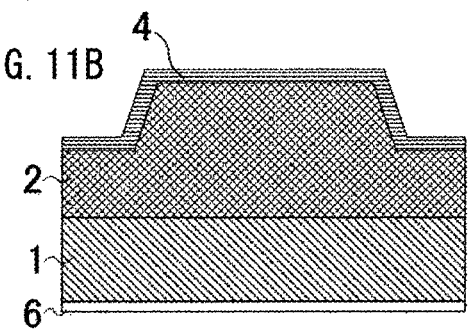
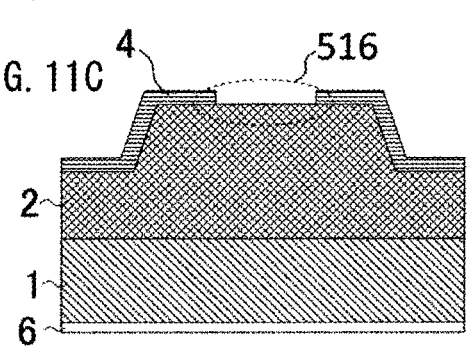
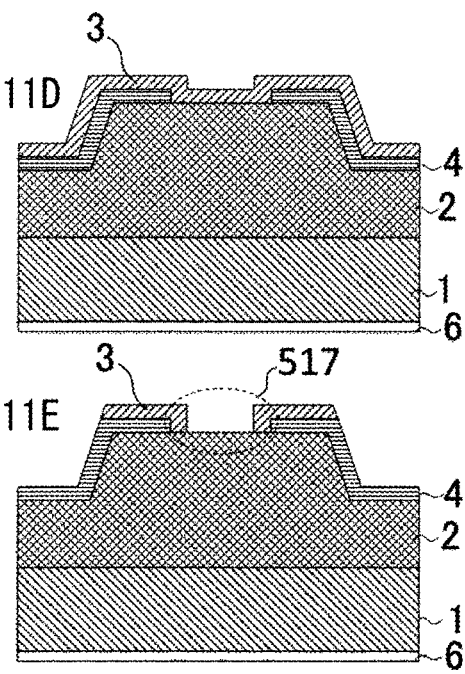
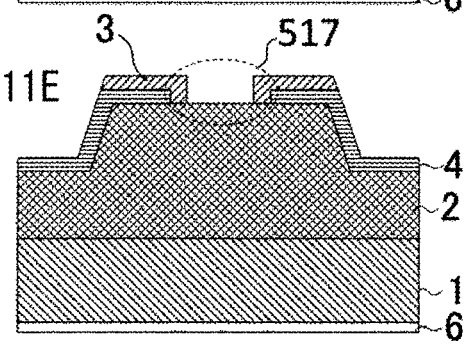
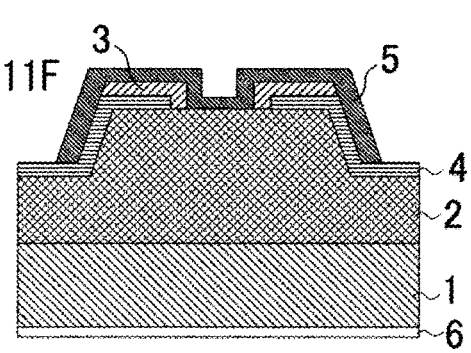

POWER SEMICONDUCTOR DEVICE

CROSS-REFERENCE TO RELATED APPLICATIONS

The present application is based on PCT filing PCT/JP2018/046578, filed Dec. 18, 2018, which claims priority to JP 2018-022222, filed Feb. 9, 2018, the entire contents of each are incorporated herein by reference.

TECHNICAL FIELD

The present invention relates to a power semiconductor device.

BACKGROUND ART

A Schottky barrier diode (referred to as an SB diode hereinafter) structure and a merged P-i-n/Schottky diode (referred to as an MPS diode hereinafter) structure in which a Schottky junction and a pn junction are provided are developed to increase withstand voltage and capacity of a diode element.

There is a method using a single crystal wide-gap semiconductor material such as gallium oxide and aluminum nitride as a method of increasing the withstand voltage of the diode element. When it is difficult to make the single crystal wide-gap semiconductor material be of p-type, there is a method of achieving a pn junction by bonding a p-type semiconductor made up of a material different from an n-type single crystal wide-gap semiconductor to the n-type single crystal wide-gap semiconductor by a hetero junction.

When the hetero junction by different materials is achieved, a trench needs to be formed in a single crystal wide-gap semiconductor material which is to be an n-type semiconductor and a p-type semiconductor material needs to be embedded in the trench to efficiently achieve an electric-field-limiting structure.

An MPS diode disclosed in Patent Document 1 includes a Schottky junction and a pn junction, and a pn junction part performs a bipolar operation, thus a voltage drop can be reduced in an occurrence of a serge current, and forward direction serge tolerated dose is improved compared with an SB diode.

In a semiconductor device in Patent Document 2, a trench is formed in an n-type semiconductor and a p-type semiconductor material is embedded in a lower region of the trench to form a hetero junction. Furthermore, an oxide layer is provided in an upper region of the trench and the n-type semiconductor in the upper region of the trench and a contact layer are separated from each other, thus an electric-field-limiting structure is achieved.

In the semiconductor device in Patent Document 2, a defect is formed in the n-type semiconductor due to etching in forming the trench. Furthermore, a crystal orientation of a side surface of the trench is not a main surface, so that a defect density increases compared with a case where a crystal orientation of an interface is a main surface.

The defect caused by the etching process and the crystal orientation of the interface causes increase in a leakage current. That is to say, there is a problem that part having a high defect density is formed near a surface of a semiconductor and a Schottky junction interface is formed near the part having the high defect density, thus a fluctuation in a threshold voltage and increase in a leakage current occur as a whole device.

In a semiconductor device in Patent Document 3, an insulating film is disposed between a pn junction interface and an anode electrode, and a leakage current from the pn junction interface in a reverse bias is reduced. However, in the semiconductor device in Patent Document 3, there is a problem that potential on a n-type semiconductor side fluctuates at the pn junction interface in accordance with a fluctuation in a potential difference in the Schottky junction formed between the n-type semiconductor and the anode electrode and the leakage current increases.

PRIOR ART DOCUMENTS

Patent Documents

Patent Document 1: Japanese Patent Application Laid-Open No. 2015-065469
Patent Document 2: Japanese Unexamined Patent Application Publication (Translation of PCT Application) No. 2008-519447
Patent Document 3: Japanese Patent Application Laid-Open No. 2013-222798

SUMMARY

Problem to be Solved by the Invention

The present invention therefore has been made to solve the above problems, and it is an object to provide a power semiconductor device reducing a leakage current due to a defect layer and having a small fluctuation in a threshold voltage.

Means to Solve the Problem

A power semiconductor device according to the present invention includes: a single crystal n-type semiconductor substrate; an n-type epitaxial film layer formed on a surface of the single crystal n-type semiconductor substrate and having a concave portion and a convex portion; a cathode electrode formed on a surface on an opposite side of the surface of the single crystal n-type semiconductor substrate; an insulating film formed on a first region in a top portion of the convex portion; a p-type thin film layer formed on a surface of the insulating film and a surface of the n-type epitaxial film layer to form a pn junction between the p-type thin film layer and the n-type epitaxial film layer; and an anode electrode, at least part of which is formed on a surface of the p-type thin film layer and part of which passes through the p-type thin film layer and the insulating film to form a Schottky junction between the anode electrode and the n-type epitaxial film layer in a second region which is separated from an edge portion of the top portion by the first region.

Effects of the Invention

According to the present invention, a power semiconductor device reducing the leakage current due to the defect layer and having the small fluctuation in the threshold voltage can be provided.

BRIEF DESCRIPTION OF DRAWINGS

FIG. 3 A cross-sectional view illustrating a pn junction region, a Schottky junction region, and an insulating region in the power semiconductor device according to the embodiment 1 of the present invention.

FIGS. 6A and 6B Configuration diagrams of a power semiconductor device according to an embodiment 2 of the present invention.

FIGS. 11A to 11F Diagrams illustrating a state after each manufacturing process of the power semiconductor device according to the embodiment 4 of the present invention.

DESCRIPTION OF EMBODIMENT(S)

Embodiment 1

Embodiments of the present invention are described in detail using the drawings hereinafter. The embodiments described below are in all aspects illustrative and does not restrict the invention.

Figure 1A:
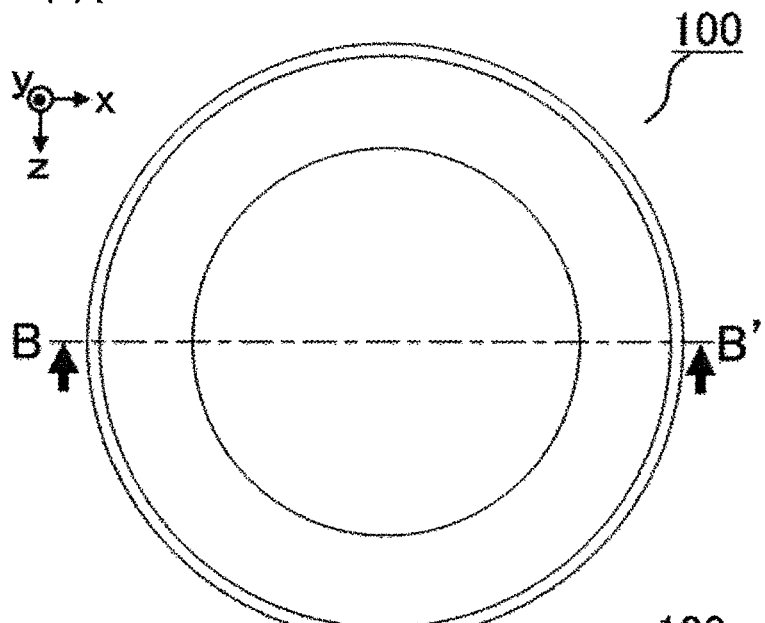
FIGS. 1A to 1C Configuration diagrams of a power semiconductor device according to an embodiment 1 of the present invention.
Figure 1B:
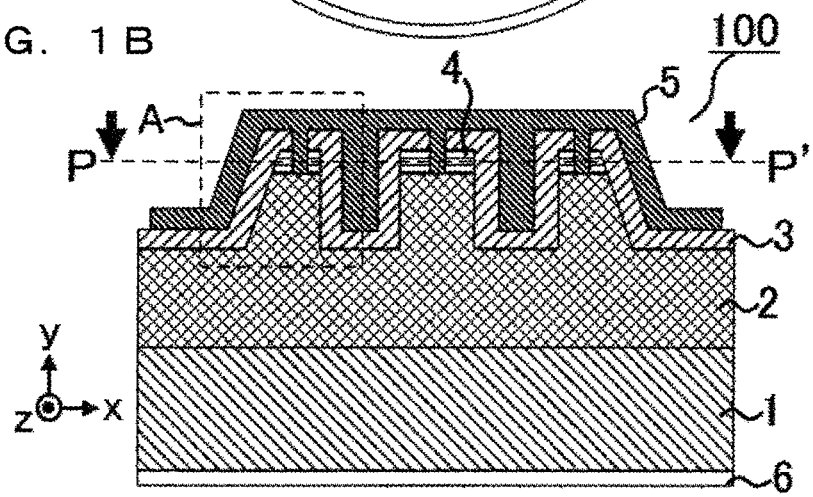
Figure 1C:
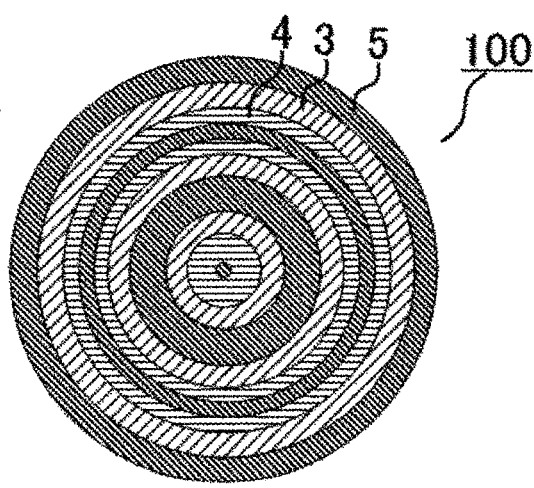

Each of FIGS. 1A to 1C is a configuration diagram of a power semiconductor device 100 according to an embodiment 1 of the present invention. An x axis, a y axis, and a z axis, which are coordinate axes of three-axis rectangular coordinate system are illustrated in FIG. 1A, FIG. 1B, and FIG. 1C. FIG. 1A is a planar view of the power semiconductor device 100. FIG. 1B is a cross-sectional view of the power semiconductor device 100 showing a cross section at a surface BB' in FIG. 1A. FIG. 1C is a cross-sectional view of the power semiconductor device 100 at a surface PP' (the surface PP' is parallel to a surface xz) in FIG. 1B.

A positive direction of the y axis is referred to an upper direction hereinafter. A negative direction of the y axis is referred to a lower direction. A single crystal n-type semiconductor substrate 1 is disposed to be parallel to the surface xz.

A surface of each constituent element on a side of the positive direction of the y axis is referred to as an upper surface (front surface), and a surface of each constituent element on a side of the negative direction of the y axis is referred to as a lower surface. A portion of the constituent element constituting a boundary with the outside is referred to as an external surface of the constituent element in some cases.

The power semiconductor device 100 is made up of the single crystal n-type semiconductor substrate 1. A cathode electrode 6 is formed on a lower surface of the single crystal n-type semiconductor substrate 1, and an n-type epitaxial film layer 2, an insulating layer 4, a p-type thin film layer 3, and an anode electrode 5 are formed in layers on an upper side of the single crystal n-type semiconductor substrate 1.

Figure 2A:
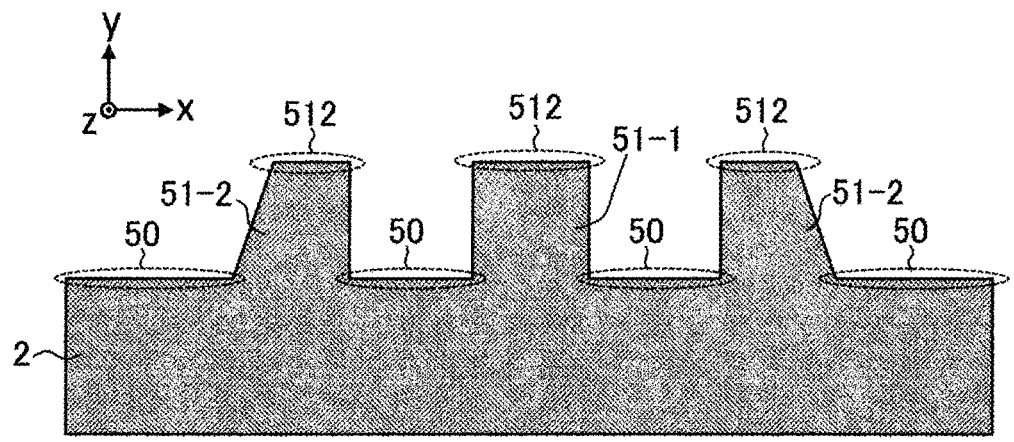
FIGS. 2A to 2C Cross-sectional views of an n-type epitaxial film layer according to the embodiment 1 of the present invention.
Figure 2B:
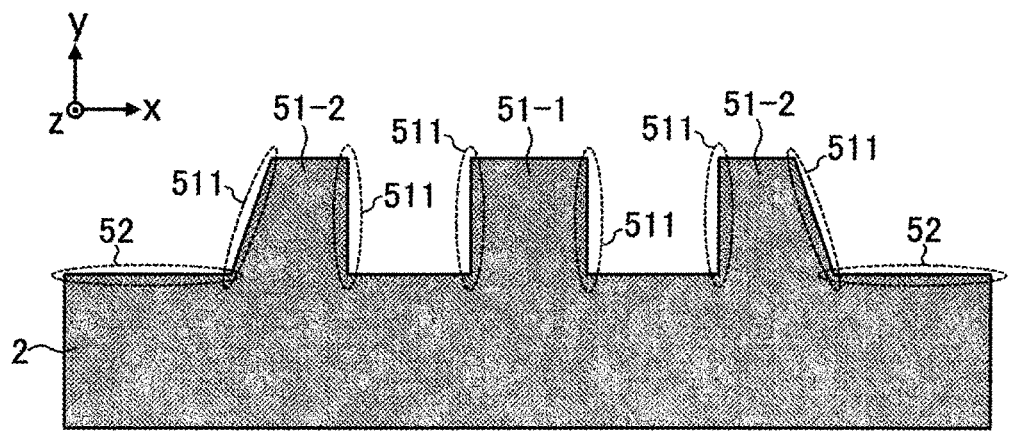
Figure 2C:
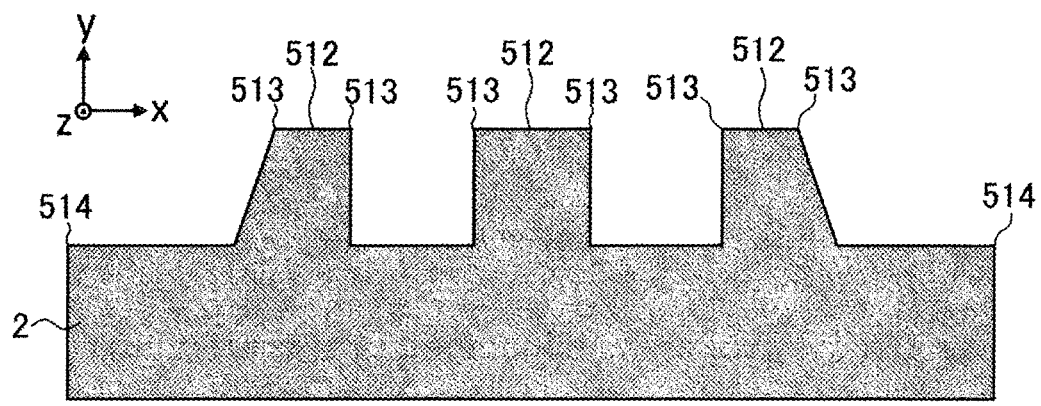

The power semiconductor device 100 and the constituent elements thereof have a rotationally symmetrical shape, however, the shape is not limited thereto. Each of FIGS. 2A to 2C is a cross-sectional view of the n-type epitaxial film layer 2 according to the embodiment 1. Each of FIG. 2A, FIG. 2B, and FIG. 2C illustrates a cross section at the surface BB' of the n-type epitaxial film layer 2, and a reference number is assigned to each portion.

A name of each portion of the n-type epitaxial film layer 2 is described hereinafter. An upper surface of the n-type epitaxial film layer 2 is divided into two portions, and the two portions are referred to as a concave portion 50 and a convex portion 51 as illustrated in FIG. 2A and FIG. 2C. In the surface xz, the concave portion 50 between the convex portions 51 is referred to as a groove portion, the concave portion 50 between the convex portion 51 and an outer edge 514 of the n-type epitaxial film layer 2 is referred to as a mesa bottom portion 52.

FIG. 2B illustrates a concave portion 51-1 which is the concave portion 51 having an island shape and a concave portion 51-2 which is the concave portion 51 having an annular shape.

Herein, the outer edge 514 is an end portion in the surface xz of the n-type epitaxial film layer 2 as illustrated in FIG. 2C. The convex portion 51 protrudes upward with respect to the concave portion 50. The convex portion 50 dents downward with respect to the convex portion 51. An outer surface located on a topmost side of the concave portion 51 is referred to as a top portion 512 as illustrated in FIG. 2A.

The top portion 512 is a surface on an upper side of the convex portion 51, and as illustrated in FIG. 2B, a portion between the top portion 512 and the concave portion 50 in the outer surface is referred to as a side surface 511. The convex portion 51 is made up of the top portion 512 and the side surface 511.

The side surface 511 needs not necessarily be perpendicular to the single crystal n-type semiconductor substrate 1. As illustrated in FIG. 2C, a boundary between the top portion 512 and the side surface 511 is referred to as an edge portion 513. Described above is the name of each portion of the n-type epitaxial film layer 2.

FIG. 3 is a cross-sectional view illustrating a pn junction region, a Schottky junction region, and an insulating region in the power semiconductor device. FIG. 3 illustrates an enlarged view of a portion A in FIGS. 1A to 1C, and further shows a name of each portion of the n-type epitaxial film layer 2. Described hereinafter are an arrangement and a shape of the n-type epitaxial film layer 2, the insulating layer 4, the p-type thin film layer 3, and the anode electrode 5 using FIGS. 1A to 1C, FIGS. 2A to 2C, and FIG. 3.

The insulating layer 4 is formed on part of the top portion 512 in the upper surface of the n-type epitaxial film layer 2. As illustrated in FIG. 3, part of an outer surface of the n-type epitaxial film layer 2 where the insulating layer 4 is formed is referred to as an insulating region 57 (first region). As illustrated in FIG. 1B, the p-type thin film layer 3 is formed on the concave portion 50 and the side surface 511 of the n-type epitaxial film layer 2.

As illustrated in FIG. 3, part of the outer surface of the n-type epitaxial film layer 2 where the p-type thin film layer 3 is formed is referred to as a pn junction region 55. The anode electrode 5 is formed on part of the top portion 512, and a Schottky junction is formed between the anode electrode 5 and the n-type epitaxial film layer 2. As illustrated in FIG. 3, the part of the top portion 512 where the anode electrode 5 is formed is referred to as a Schottky junction region 56 (second region).

As illustrated in FIG. 3, the insulating region 57 separates the edge portion 513 and the Schottky junction region 56 on the outer surface of the n-type epitaxial film layer 2.

Next, the outer surface of the n-type epitaxial film layer 2 is described in more detail. As illustrated in FIG. 2A, the convex portion 51-1 (first convex portion) having the island shape is formed on the upper surface of the n-type epitaxial film layer 2, and the groove portion which is the concave portion 50 surrounds an outer periphery of the convex portion 51-1.

The convex portion 51-2 (second convex portion) having the annular shape surrounds an outer periphery of the concave portion 50 which is the groove portion, and the mesa bottom portion 52 which is the concave portion 50 is further formed between an outer periphery of the convex portion 51-2 and the outer edge 514. The number of the convex portions 51-2 surrounding the convex portion 51-1 can be further increased.

When the number of the convex portions 51-2 is increased, the convex portion 51-2 is disposed to surround the convex portion 51-1 doubly or more, and the mesa bottom portion 52 is formed between the convex portion 51-2 disposed in a position closest to the outer edge 514 and the outer edge 514.

As illustrated in FIGS. 1A to 1C, FIGS. 2A to 2C, and FIG. 3, the Schottky junction region 56 and the insulating region 57 are formed on the top portion 512 of the convex portion 51-1. In the top portion 512 of the convex portion 51-1, the insulating region 57 is disposed in the outer periphery of the Schottky junction region 56 to separate the Schottky junction region 56 and the edge portion 513.

The Schottky junction region 56 and the insulating region 57 are also formed on the top portion 512 of the convex portion 51-2. In the top portion 512 of the convex portion 51-2, the insulating region 57 is disposed in an inner periphery and the outer periphery of the Schottky junction region 56 so that the insulating region 57 separates the Schottky junction region 56 and the edge portion 513.

The arrangement that the insulating region 57 separates the Schottky junction region 56 and the edge portion 513 indicates an arrangement that an optional path passing through the top portion 512 from the Schottky junction region 56 to the edge portion 513 passes through the insulating region 57.

When the number of convex portions 51-2 is increased to two or more, it is preferable that the Schottky junction region 56 and the insulating region 57 are provided on all of the convex portions 51-2 and the insulating region 57 separates the Schottky junction region 56 and the edge portion 513.

According to such a configuration, even when an area of a Schottky junction is increased to reduce an electrical resistance, the insulating region 57 is disposed near each Schottky junction region 56, and exerted on each Schottky junction is an effect of reducing a leakage current by the insulating region 57.

That is to say, the effect of reducing the leakage current by the insulating region 57 can be exerted on each Schottky junction region 56. Herein, in FIGS. 1A to 1C, the convex portion 51-2 has the annular shape, however, the shape thereof is not limited thereto, thus a quadrangle shape is also applicable, for example.

The Schottky junction region 56 and the insulating region 57 can be disposed in accordance with the shape of the convex portion 51-2, and a portion between the edge portion 513 which is an end portion of the top portion 512 and the Schottky junction region 56 (the second region) can be separated by the insulating region 57 (the first region).

As illustrated in FIG. 1B, the p-type thin film layer 3 is formed on an upper surface of the concave portion 50 in the n-type epitaxial film layer 2 and an upper surface of the insulating film 4. The anode electrode 5 is formed on an upper surface of the p-type thin film layer 3 formed on the upper surface of the concave portion 50.

The anode electrode 5 formed in the concave portion 50 is located below the top portion 512, and the anode electrode 5 is located closer to a negative side of the y axis in relation to the top portion 512 in comparison in a coordinate of y axis. That is to say, it can be deemed that the top portion 512 of the convex portion 51 in the n-type epitaxial film layer 2 is located above part of the anode electrode 5 formed on the surface of the p-type thin film layer 3 formed on the surface of the concave portion 50.

Herein, the anode electrode 5 formed in the concave portion 50 indicates part of the anode electrode 5 formed on the upper surface of the p-type thin film layer 3 formed on the upper surface of the concave portion 50. That is to say, it indicates part of the anode electrode 5 intersecting with a line extending from a point on the concave portion 50 in parallel to the y axis.

A defect layer on the upper surface of the n-type epitaxial film layer 2 is described below. A convex-concave structure on the upper surface of the n-type epitaxial film layer 2 is formed by etching in manufacturing the power semiconductor device 100.

Figure 4:
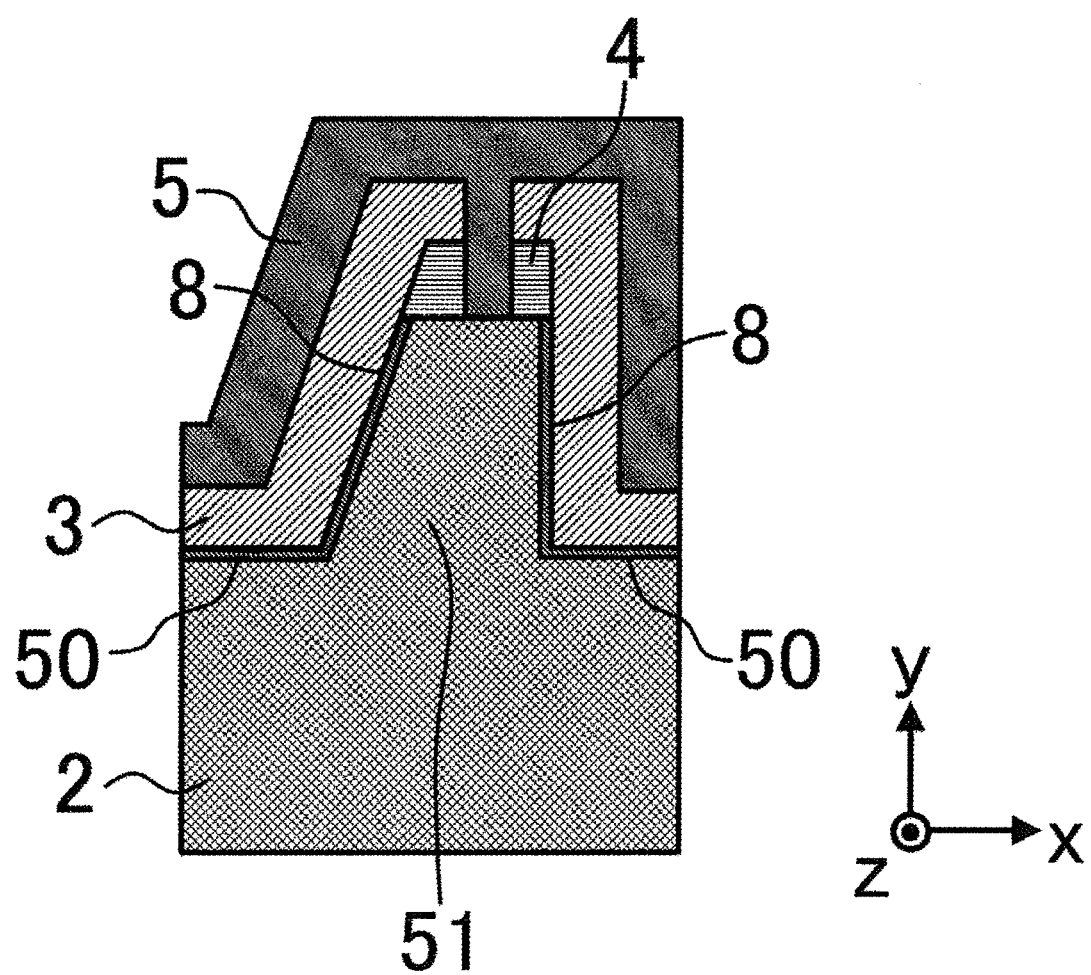
FIG. 4 A cross-sectional view illustrating a main portion of the power semiconductor device according to the embodiment 1 of the present invention.

FIG. 4 is a cross-sectional view illustrating a main portion of the power semiconductor device 100 according to the embodiment 1. FIG. 4 illustrates an enlarged view of the portion A in FIG. 1B, and shows a defect layer 8. The defect layer 8 is formed by etching, and is distributed to the surface and near the surface of the n-type epitaxial film layer 2. The defect layer 8 is part of the n-type epitaxial film layer 2, and includes a large amount of defect compared with part of the n-type epitaxial film layer 2 other than the defect layer 8.

In an etching process described below, a mask is formed on the top portion 512, thus removal processing is not performed thereon. The removal processing is performed on the side surface 511 and the concave portion 50 by etching. Thus, the defect layer 8 is not formed on the top portion 512 on which the etching is not performed, and the defect layer 8 is formed on the side surface 511 and the concave portion 50.

A factor of formation of defect different from etching is described. The n-type epitaxial film layer 2 frequently includes a main surface in a y axis direction, and an outer surface of the side surface 511 is perpendicular to or inclined with respect to the main surface. Thus, a plane direction appearing on the outer surface of the n-type epitaxial film layer 2 is varied in accordance with a position.

Herein, the plane direction is a direction perpendicular to a crystal surface of the outer surface. The plane direction varied in accordance with the position causes a generation of defect in the side surface 511. A region having a high defect density appears near the surface of the side surface 511.

Described next is how the leak current is reduced in the power semiconductor device 100. A potential difference of the anode electrode 5 from the cathode electrode 6 is defined as a forward potential difference. A state where potential of the anode electrode 5 is higher than that of the cathode electrode 6 is referred to as a forward bias.

The p-type thin film layer 3 or the insulating film 4 is formed on an outer surface of the defect layer 8. A dangling bond on the outer surface of the defect layer 8 is bonded to a dangling bond of the p-type thin film layer 3 or the insulating film 4, and the defect does not act as a donor or an acceptor. The defect in the defect layer 8 is inactivated, and the defect density is reduced, thus a forward leakage current and a backward leakage current caused by the defect layer 8 is reduced.

The effect of the reduction in the leakage current caused by the inactivation of the defect is exerted in both the forward bias and the reverse bias. Next, the time of the reverse bias in a low voltage is described. The reverse bias in the low voltage indicates a case where a potential difference in a reverse direction is smaller than several V to several tens of V (a specific voltage value varies depending on a material and a structure. A numeral value is indicated as an example).

In the reverse bias in the low voltage, a formation of a depletion layer caused by the p-type thin film layer 3 on the side surface 511 is prevented by the defect layer 8, and the depletion layer cannot reach a region around the Schottky junction region 56. Thus, the depletion layer around the Schottky junction region 56 is a depletion layer deriving from the Schottky junction and is a depletion layer formed with narrow width and narrow range. The width of the depletion layer herein indicates a width in the x axis direction and the y axis direction.

In a conventional power semiconductor device, an intensity of electrical field caused by the Schottky junction gets high in an end portion of the Schottky junction by reason that the width of the depletion layer described above is small. In addition, a recombination current occurs due to the defect layer 8, and the reverse leakage current flows via the Schottky junction.

In the power semiconductor device 100, the defect density of the defect layer 8 is reduced by the insulating film 4 as described above, thus the recombination current hardly occurs. Furthermore, the p-type thin film layer 3 is formed on the upper surface of the insulating film 4, thus a depletion layer is formed in the insulating region 57 in accordance with a potential difference between the p-type thin film layer 3 and the n-type epitaxial film layer 2.

In the power semiconductor device 100, the depletion layer caused by the potential difference between the p-type thin film layer 3 and the n-type epitaxial film layer 2 spreads to the Schottky junction region 56, thus the reverse leakage current in the reverse bias in the low voltage is reduced.

When the voltage in the reverse bias further increases in the power semiconductor device 100, the defect layer 8 is depleted in accordance with the potential difference between the p-type thin film layer 3 and the n-type epitaxial film layer 2, thus an influence of the leakage current generated via the defect in the high voltage can be suppressed.

Next, an operation at the time of the reverse bias in a high voltage is described. Herein, a state where the potential difference in the reverse direction exceeds several hundred V is referred to as a reverse bias in a high voltage (a specific voltage value varies depending on a material and a structure. A numeral value is indicated as an example).

A depletion layer formed in the pn junction interface of the concave portion 50 spreads to a side of the convex portion 51 at the time of the reverse bias in the high voltage. The electrical field in the Schottky junction is reduced by the depletion layer, and the leakage current in the reverse direction is reduced. Next, an operation at the time of the forward bias is described.

A voltage value at a time when a value of current flowing in the Schottky junction in the forward direction exceeds specified value in a case where the potential difference in the forward direction increases is defined as a threshold voltage hereinafter unless otherwise noted. For example, a current value determined to exceed an upper limit of the leakage current and to be switched from a non-conduction state to a conduction state in the power semiconductor device 100 can be selected as a specified value.

In the manner similar to the reverse bias in the low voltage, a depletion layer is formed in the insulating region 57 in accordance with the potential difference between the p-type thin film layer 3 formed on the upper surface of the insulating film 4 and the n-type epitaxial film layer 2 at the time of the forward bias in the low voltage. The depletion layer decreases as the potential difference in the forward direction gets large.

The electrical field spreads from the Schottky junction region 56 as the potential difference in the forward direction gets large, and reaches the side surface 511. When the potential difference in the forward direction is smaller than a threshold value and the potential difference in the forward direction is smaller than the potential difference between the p-type thin film layer 3 and the n-type epitaxial film layer 2, the current does not flow in the pn junction.

In the conventional power semiconductor device, when the electrical field spreads and reaches the defect layer 8 on the side surface 511 in such a state, the recombination current deriving from the defect occurs accordingly. In the meanwhile, in the power semiconductor device 100 of the present invention, the side surface 511 is adjacent to the p-type thin film layer 3, and the potential difference between the p-type thin film layer 3 and the n-type epitaxial film layer 2 is larger than the potential difference between the anode electrode 5 and the n-type epitaxial film layer 2.

Thus, the increase in the field intensity at the interface between the insulating film 4 and the top portion 512 can be suppressed in the state where the potential difference in the forward direction is smaller than the threshold value and the potential difference in the forward direction is smaller than the potential difference between the p-type thin film layer 3 and the n-type epitaxial film layer 2.

The increase in the field intensity at the interface between the insulating film 4 and the top portion 512 is suppressed, and electron injection is suppressed, thus reduced is the leakage current in the forward direction flowing in the Schottky junction via the defect layer 8 such as the recombination current. That is to say, the leakage current in the forward direction is reduced until the forward current flowing in the Schottky junction gets sufficiently large. A fluctuation in the threshold voltage due to the influence of the defect layer 8 can be suppressed.

When the forward voltage further gets large and the forward current flowing in the Schottky junction gets sufficiently large, the current flows by the electrical field spreading from the Schottky junction interface to the top portion 512 due to the voltage applied to the Schottky junction.

Described is a configuration of the power semiconductor device 100 including the p-type thin film layer 3, in place of the insulating film 4, in a position where the insulating film 4 is located in the power semiconductor device 100 to describe an effect caused by the insulating film 4 in the power semiconductor device 100.

In the configuration that the p-type thin film layer 3 is formed in the position where the insulating film 4 is located, the defect density of the defect layer 8 is not reduced, thus the effect of suppressing the increase in the potential due to the pn junction near the Schottky junction region 56 is small. Thus, the recombination current deriving from the defect layer 8 flows into the Schottky junction region 56, and the leakage current increases.

As described above, the power semiconductor device 100 according to the present invention can reduce the leakage current and suppress the fluctuation in the threshold voltage in both cases of the forward bias and the reverse bias. It is possible to reduce the leakage current caused by the defect layer 8 generated by the formation of the convex-concave structure by etching or the difference of the crystal plane direction of the interface with that of the main surface.

Diffusion potential between the anode electrode 5 and the n-type epitaxial film layer 2 is formed by a difference of a fermi level of the n-type epitaxial film layer 2 and a work function of the anode electrode 5. Thus, when a material of the anode electrode 5 and a material of the p-type thin film layer 3 are selected, the potential difference between the p-type thin film layer 3 and the n-type epitaxial film layer 2 can be made larger than the potential difference between the anode electrode 5 and the n-type epitaxial film layer 2.

In the power semiconductor device 100, a three-layer structure made up of the p-type thin film layer 3, the insulating film 4, and the n-type epitaxial film layer 2 is formed between the pn junction formed in the defect layer 8 formed by providing the convex-concave structure and the Schottky junction region 56. Diffusion potential between the n-type epitaxial film layer 2 and the p-type thin film layer 3 is larger than that between the n-type epitaxial film layer 2 and the anode electrode 5.

Thus, the leakage current can be reduced at both the time of the forward bias and the reverse bias and the fluctuation in the threshold voltage at the time of the forward bias can be suppressed. As described above, the power semiconductor device 100 can reduce the leakage current at the time of the forward bias and the reverse bias and suppress the fluctuation in the threshold voltage. The recombination current deriving from the defect layer 8 can be reduced.

The arrangement that the insulating region 57 separates the Schottky junction region 56 and the edge portion 513 generates the effect described above. The effect is also obtained by an arrangement that the insulating region 57 separates part of a region between the Schottky junction region 56 and the edge portion 513. The larger effect is obtained when the insulating region 57 is provided near a region having a large amount of defect such as a specific plane direction, for example. Even larger effect is obtained when the insulating region 57 is provided in all the region between the Schottky junction region 56 and the edge portion 513.

A method of manufacturing the power semiconductor device 100 is described next. Each of FIGS. 5A to 5F illustrates a state after each manufacturing process of the power semiconductor device 100 according to the embodiment 1. A material of the single crystal n-type semiconductor substrate 1 is a wide-gap material having wider band gap than Si.

Gallium oxide ($Ga_2O_3$) and aluminum gallium nitride containing aluminum nitride ($Al_{1-x}Ga_xN$, wherein $0 \leq x \leq 1$), for example, can be used as the wide-gap material.

It is difficult to make such a wide-gap material be of p-type, and the pn junction needs to be achieved by bonding materials belonging to different material systems by the hetero junction, so that the defect readily occurs at the hetero junction interface. Thus, the effect of the present invention is exerted to a large degree in a material which can be hardly of p-type compared with a material which can be easily of p-type.

The single crystal n-type semiconductor substrate 1 according to the embodiment 1 is made of gallium oxide ($Ga_2O_3$). The n-type gallium oxide substrate can be manufactured by cutting the substrate out of a single crystal bulk of $\beta$-$Ga_2O_3$ manufactured by a melt growth method into a shape of the substrate. A substrate containing an n-type impurity made of silicone (Si) or tin (Sn), for example, may be used as the n-type gallium oxide substrate.

The n-type gallium oxide substrate shows an n-type conductivity in accordance with an oxygen defect in a crystal, thus a substrate which does not contain the n-type impurity can also be used. An n-type carrier concentration of the n-type gallium oxide substrate is a sum of an oxygen defect concentration and an n-type impurity concentration. A value of the n-type carrier concentration may be equal to or larger than $1 \times 10^{17}$ cm$^{-3}$ as an example.

It is also applicable to increase the impurity concentration of the n-type gallium oxide substrate to increase the n-type carrier concentration and reduce a contact resistance between the n-type gallium oxide substrate and the anode electrode 5.

When the single crystal n-type semiconductor substrate 1 is made of gallium oxide, the n-type epitaxial film layer 2 may be an n-type gallium oxide epitaxial film layer. The n-type gallium oxide epitaxial film layer can be formed by a molecular beam epitaxy (MBE) method or a halide vapor phase epitaxy (HVPE) method.

The n-type gallium oxide epitaxial film layer is formed on the upper surface of the single crystal n-type semiconductor substrate 1. When a material which is the same as that of the single crystal n-type semiconductor substrate 1 is selected as a material of the n-type epitaxial film layer 2, an interface having less defect can be formed. The n-type gallium oxide epitaxial film layer is an n-type oxide semiconductor made of a single crystal of $Ga_2O_3$, and is preferably an n-type oxide semiconductor made of a single crystal of $\beta$-$Ga_2O_3$.

The n-type carrier concentration of the n-type gallium oxide epitaxial film layer is preferably lower than the n-type carrier concentration of the n-type gallium oxide substrate. The n-type carrier concentration of the n-type gallium oxide epitaxial film layer may be equal to or larger than $1 \times 10^{14}$ cm$^{-3}$ and equal to or smaller than $1 \times 10^{17}$ cm$^{-3}$, for example.

Figure 5A:
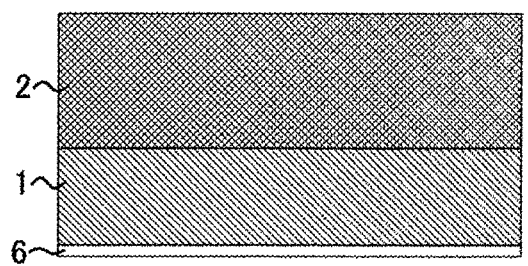
FIGS. 5A to 5F Diagrams illustrating a state after each manufacturing process of the power semiconductor device according to the embodiment 1 of the present invention.

A metal material is deposited on a lower surface of the n-type oxide gallium substrate by a deposition method or a sputtering method to form the cathode electrode 6. FIG. 5A is a cross-sectional view illustrating a state after the n-type epitaxial film layer 2 and the cathode electrode 6 are formed on the single crystal n-type semiconductor substrate 1.

The cathode electrode 6 is bonded to the single crystal n-type semiconductor substrate 1 by an ohmic junction, thus it is preferable to use a metal having a smaller work function than the single crystal n-type semiconductor substrate 1. Preferable as a material of the cathode electrode 6 is a metal material having characteristics that a contact resistance between the single crystal n-type semiconductor substrate 1 and the cathode electrode 6 is reduced by performing a thermal treatment after forming the cathode electrode 6 on the lower surface of the single crystal n-type semiconductor substrate 1.

Titanium (Ti), for example, can be used as the metal material of the cathode electrode 6. The cathode electrode 6 may be made by forming a plurality of metal materials in layers. For example, when a metal material having contact with a rear surface of the single crystal n-type semiconductor substrate 1 is an easy-oxidizable material, also applicable is a configuration that a metal material which is resistant to oxidizing is formed on the lower surface of the easy-oxidizable metal material to form the cathode electrode 6 having a layer structure, thereby preventing an oxidization from the surface having contact with air.

For example, titanium is deposited on the lower surface of the single crystal n-type semiconductor substrate 1 by an electron beam evaporation (an EB evaporation) with a thickness of 100 nanometers (nm). Furthermore, Ag is deposited on a lower surface of titanium by the electron beam evaporation with a thickness of 300 nanometers to form the cathode electrode 6 having two-layer structure. Subsequently, a thermal treatment at 550° C. is performed for five minutes under a nitrogen atmosphere or an oxygen atmosphere, thereby being able to form the cathode electrode 6 having a layer structure.

Figure 5B:
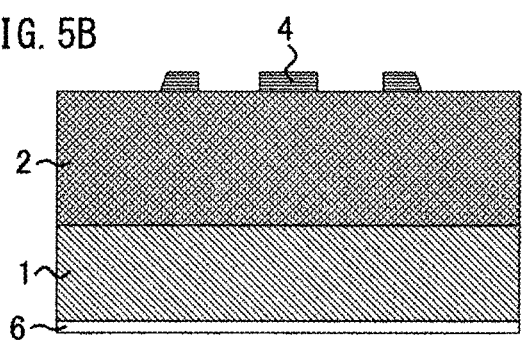

Next, the insulating film 4 is formed on part of the upper surface of the n-type epitaxial film layer 2. The insulating film 4 is preferably made up of a material having a high electronic barrier against $Ga_2O_3$ constituting the n-type epitaxial film layer 2. FIG. 5B is drawing illustrating a cross-sectional structure after the insulating film 4 is formed.

Silicon dioxide ($SiO_2$), silicon nitride (SiN), and aluminum oxide ($Al_2O_3$), for example, is preferable as the material of the insulating film 4 having the high electronic barrier against $Ga_2O_3$.

Figure 5C:
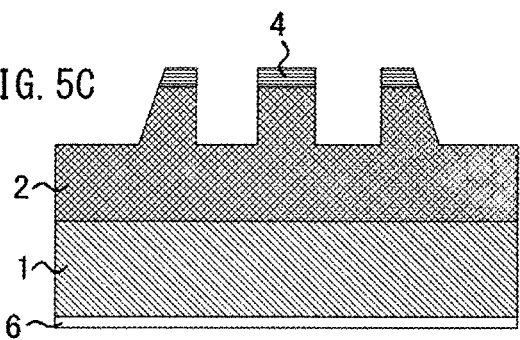

Next, an etching process is performed to form the convex-concave structure. Firstly, a mask material is formed by photolithography, and subsequently, the etching is performed by a wet etching process using hydrofluoric acid or a dry etching process using carbon tetrafluoride ($CF_4$) to pattern the insulating film 4. FIG. 5C is a drawing illustrating a cross-sectional structure after the etching process.

The convex-concave structure including a mesa structure is formed on the n-type epitaxial film layer 2 by an etching process. A dry etching method using gas such as boron trichloride ($BCl_3$) is effective as a method of forming the convex-concave structure.

The convex-concave structure can also be formed using the formed insulating film 4 as a mask. However, when an etching selectivity cannot be ensured as much as needed or when the insulating film 4 is intended to be thinly formed, a metal mask may be previously formed on the upper surface of the insulating film 4 to perform the etching process. When the metal mask is formed, the metal is removed after finishing the etching.

Figure 5D:
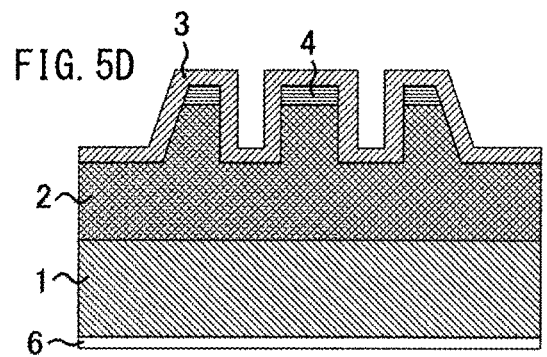

Next, as illustrated in FIG. 5D, a p-type microcrystal film which is to be the p-type thin film layer 3 is formed. In the present embodiment, the p-type thin film layer 3 is in a state of microcrystal, however, the state thereof is not limited to the microcrystal structure, but an amorphous material is also applicable. A p-type oxide semiconductor can be used for the material of the p-type thin film layer 3. The p-type oxide semiconductor shows a p-type conductivity even when the p-type impurity is not added.

The surface of the n-type epitaxial film layer 2 is formed by etching, thus various crystal orientations appear on the surface of the n-type epitaxial film layer 2. When the p-type thin film layer 3 is a polycrystal or a single crystal, a state of the interface between the p-type thin film layer 3 and the n-type epitaxial film layer 2 changes depending on the crystal orientation on the surface of the n-type epitaxial film layer 2. The p-type thin film layer 3 is preferably in a state of microcrystal having a small crystal grain diameter or an amorphous state.

Examples of the p-type oxide semiconductor include a material such as copper I oxide ($Cu_2O$), silver I oxide ($Ag_2O$), nickel oxide (NiO), and tin I oxide (SnO). Examples of the p-type oxide semiconductor further contains a material described above as the p-type semiconductor material as a main component having a highest composition ratio, and also contains a p-type material containing the other material having a smaller composition ratio than the material of the main component. Herein, a material in which a carrier carrying an electrical charge is a positive hole (hole) is referred to as the p-type material. Examples of a material in which the other material is added thereto include copper aluminum oxide ($CuAlO_2$) in which aluminum is added to copper I oxide. Electrical conductivity characteristics of the p-type thin film layer 3 are described hereinafter, applying copper I oxide as an example.

In copper (Cu) atoms contained in copper I oxide ($Cu_2O$), a 3d orbit form an upper end of a valence band which assumes a hole conduction. The positive hole occurs due to the Cu defect in copper I oxide ($Cu_2O$) even when an impurity is not added, and copper I oxide shows the p-type conductivity. In the meanwhile, copper I oxide ($Cu_2O$) changes into copper II oxide (CuO) when copper I oxide is further oxidized.

3d orbit of copper does not form an upper end of a valence band in copper II oxide (CuO), thus copper II oxide does not have the p-type conductivity. In the p-type oxide semiconductor including a metal oxide as a material, the p-type conductivity is reduced by the oxidization in the manner similar to copper I oxide ($Cu_2O$), thus it is preferable not to oxidize the p-type microcrystal film in the manufacturing process.

The p-type oxide semiconductor to which the p-type impurity is added may be used as the p-type thin film layer 3. When the p-type oxide semiconductor is copper I oxide ($Cu_2O$), nitrogen (N) can be used as the p-type impurity. When the p-type impurity is added to the p-type oxide semiconductor, a metal atom defect concentration and the p-type impurity concentration add up to the p-type carrier concentration.

When the n-type epitaxial film layer 2 is nitride, also the p-type thin film layer 3 is preferably nitride such as gallium nitride. The n-type epitaxial film layer 2 and the p-type thin film layer 3 are made of the same nitride, thus the interface therebetween can have less defect.

The p-type thin film layer 3 described above is formed on the upper surface of the n-type epitaxial film layer 2 and the surface of the insulating film 4. When the materials of the constituent elements are appropriately selected so that the diffusion potential formed by the p-type thin film layer 3 and the n-type epitaxial film layer 2 is larger than the difference between the potential of the anode electrode 5 and the potential of the n-type epitaxial film layer 2, the effect of reducing the leakage current can be increased.

In the present embodiment, a difference between a work function of many metals and an electronic affinity of gallium oxide is equal to or smaller than 1.5 eV, thus the diffusion potential is smaller than 1.5 eV. Thus, the diffusion potential formed between the p-type thin film layer 3 and the n-type epitaxial film layer 2 is preferably equal to or larger than 1.5 eV.

According to such a configuration, the potential difference higher than the difference between the materials of the n-type epitaxial film layer 2 and the anode electrode 5 can be formed between the n-type epitaxial film layer 2a and the p-type thin film layer 3 to increase the effect of reducing the leakage current.

Figure 5E:
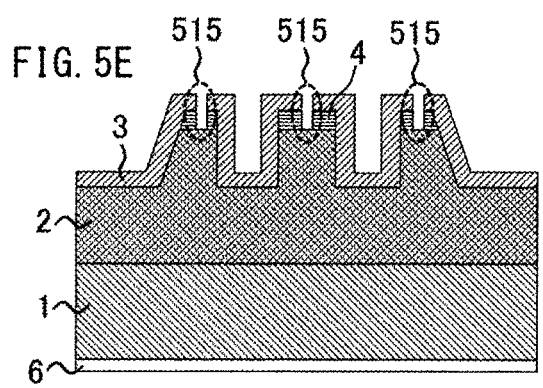

Next, as illustrated in FIG. 5E, an opening part 515 reaching the top portion 512 of the n-type epitaxial film layer 2 from the upper surface of the p-type thin film layer 3 is formed. The opening part 515 passes through the p-type thin film layer 3 and the insulating film 4 formed on the upper surface of the convex portion 51, and reaches the top portion 512 of the n-type epitaxial film layer 2.

In order to form the opening part 515, layer which is to be a mask material is firstly formed on the upper surface of the p-type thin film layer 3. Next, the patterning is performed using photolithography and the mask material located in a position where the opening part 515 is to be formed is removed, and subsequently, the etching is performed.

A liftoff process can also be used as the process of forming the opening part 515. In the liftoff process, a resist is previously formed in a position where the opening part 515 of the p-type thin film layer 3 is to be formed using the photolithography before the p-type thin film layer 3 is formed.

Next, the p-type thin film layer 3 is formed, and the resist formed in the position where the opening part 515 is to be formed is removed together with the p-type thin film layer 3 on the resist. Next, the insulating film 4 is formed by the method similar to that described in FIG. 5C.

Next, the insulating film 4 formed on the opening part 515 is etched by a wet etching process or a dry etching process using the p-type thin film layer 3 as a mask to form an opening part having a depth to reach the convex portion 51 of the n-type epitaxial film layer 2. Described above is the process using the liftoff process.

Figure 5F:
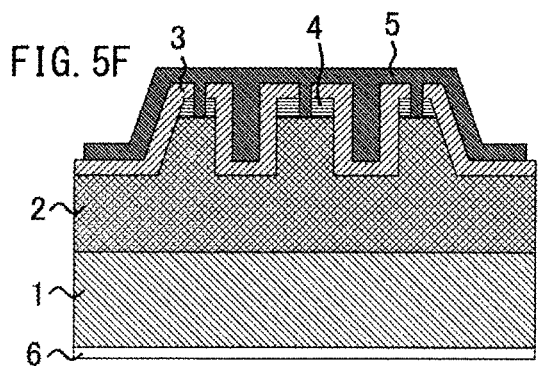

Next, the anode electrode 5 is formed as illustrated in FIG. 5F. The Schottky junction is formed between the anode electrode 5 and the n-type epitaxial film layer 2, thus the anode electrode 5 is preferably formed of a metal material having a larger work function than a fermi level of the n-type epitaxial film layer 2.

The anode electrode 5 is bonded to the p-type thin film layer 3 by an ohmic junction, thus the anode electrode 5 is preferably formed by a metal material having a smaller work function than a fermi level of the p-type semiconductor material constituting the p-type thin film layer 3. Examples of such a metal material include platinum (Pt), nickel (Ni), gold (Au), or palladium (Pd).

The anode electrode 5 may have a layer structure using a plurality of materials in the manner similar to the cathode electrode 6. For example, it is also applicable that a metal material appropriate for the Schottky junction with the convex portion 51 of the n-type epitaxial film layer 2 is formed on the convex portion 51 of the n-type epitaxial film layer 2 as a first layer, and a different metal material is formed on an upper surface of the first layer as a second layer to form the anode electrode 5 made up of two layers.

When the anode electrode 5 made up of the two layers is formed, the material of the second layer of the anode electrode 5 having direct contact with the p-type thin film layer 3 is preferably selected so that a stable ohmic junction which does not fluctuate depending on a usage environment and a process is formed between the second layer and the p-type thin film layer 3.

At this time, it is also applicable that a metal material of the first layer is selected to form a Schottky junction having a low threshold voltage between the first layer and the n-type epitaxial film layer 2.

The second layer of the anode electrode 5 has contact with the p-type thin film layer 3, thus a depletion layer is formed between the p-type thin film layer 3 and the n-type epitaxial film layer 2 at the time of the reverse bias. The depletion layer spreads from the side surface 511 and the groove portion of the n-type epitaxial film layer 2 into an inner portion of the convex portion 51.

The depletion layer spreads to the Schottky junction region 56, thus the intensity of the electrical field on the Schottky junction region 56 is reduced, and the leakage current is reduced. Furthermore, the p-type thin film layer 3 and the second layer of the anode electrode 5 are bonded by the ohmic junction, thus a large current can flow in the forward direction.

Described above is the method of manufacturing the power semiconductor device 100 according to the embodiment 1.

As described above, the power semiconductor device 100 includes the single crystal n-type semiconductor substrate 1, the n-type epitaxial film layer 2 formed on the surface of the single crystal n-type semiconductor substrate 1 and having the concave portion 50 and the convex portion 51, and the cathode electrode 6 formed on the surface on the opposite side of the surface of the single crystal n-type semiconductor substrate.

The power semiconductor device 100 further includes the insulating film 4 formed in the insulating region 57 (the first region) in the top portion 512 of the convex portion 51 and the p-type thin film layer 3 formed on the surface of the insulating film 4 and the surface of the n-type epitaxial film layer 2 to form the pn junction between the p-type thin film layer 3 and the n-type epitaxial film layer 2.

The power semiconductor device 100 further includes the anode electrode 5. The anode electrode 5 is formed on the surface of the p-type thin film layer 3, and the part thereof passes through the p-type thin film layer 3 and the insulating film 4. The anode electrode 5 forms the Schottky junction between the anode electrode 5 and the n-type epitaxial film layer 2 in the Schottky junction region 56 (the second region) in the top portion 512 which is separated from the edge portion 513 of the top portion 512 by the insulating region 57 (the first region).

According to the present embodiment, the power semiconductor device which reduces the leakage current caused by the defect layer and has the small fluctuation in the threshold voltage can be provided. Furthermore, the power semiconductor device which has the small leakage current caused by the defect layer and the small fluctuation in the threshold voltage in both cases of the forward bias and the reverse bias can be provided.

Embodiment 2

A configuration of a power semiconductor device 100a according to an embodiment 2 is different from the configuration of the power semiconductor device 100 according to the embodiment 1 in that the insulating film 4 is formed on the side surface 511 of the n-type epitaxial film layer 2. Each of FIGS. 6A and 6B is a configuration diagram of the power semiconductor device 100a according to the embodiment 2.

An x axis, a y axis, and a z axis, which are coordinate axes of three-axis rectangular coordinate system are illustrated in FIG. 6A and FIG. 6B. FIG. 6A is a planar view of the power semiconductor device 100a. FIG. 6B is a cross-sectional view of the power semiconductor device 100a illustrating a cross section at a surface DD' in FIG. 6A.

A name of each portion of the n-type epitaxial film layer 2 is the same as that in the embodiment 1. The constituent elements and the name of each portion are illustrated by drawing a lead line only in one position even when they are separated into a plurality of portions.

The power semiconductor device 100a is made up of the single crystal n-type semiconductor substrate 1 in the manner similar to the power semiconductor device 100 in the embodiment 1. The cathode electrode 6 is formed on the lower surface of the single crystal n-type semiconductor substrate 1, and the n-type epitaxial film layer 2, the insulating layer 4, the p-type thin film layer 3, and the anode electrode 5 are formed in layers on the upper side of the single crystal n-type semiconductor substrate 1.

The insulating film 4 is formed on the side surface 511 in the power semiconductor device 100a as illustrated in FIG. 6B. This configuration is different from that of the power semiconductor device 100 according to the embodiment 1. The p-type thin film layer 3 is formed on the upper surface of the n-type epitaxial film layer 2 and the upper surface of the insulating film 4. The anode electrode 5 is formed on the upper surface of the p-type thin film layer 3.

Part of the anode electrode 5 passes through the p-type thin film layer 3 and the insulating film 4, extends in the negative direction of the y axis, and reaches the top portion 512. The anode electrode 5 formed in the concave portion 50 is located below the top portion 512 of the n-type epitaxial film layer 2. That is to say, the anode electrode 5 is located in the negative direction of the y axis.

Herein, the anode electrode 5 formed in the concave portion 50 indicates part of the anode electrode 5 formed on the upper surface of the p-type thin film layer 3 formed on the upper surface of the concave portion 50. The same reference numerals are assigned to the same constituent elements as those illustrated in FIGS. 1A to 1C in the embodiment 1, and the repetitive description is omitted.

An operation of the power semiconductor device 100a is described hereinafter. The power semiconductor device 100a has the effect of reducing the leakage current at the time of the forward bias and the reverse bias and suppressing the fluctuation in the threshold voltage by an operation principle similar to that of the power semiconductor device 100 in the embodiment 1.

The insulating film 4 is formed on the side surface 511 in the power semiconductor device 100a. Thus, a constituent element and an impurity contained in the p-type thin film layer 3 are blocked by the insulating film 4 formed on the side surface 511, and can be prevented from passing through the side surface 511 and being diffused into the inner portion of the convex portion 51 of the n-type epitaxial film layer 2.

The diffusion of the impurity into the inner portion of the n-type epitaxial film layer 2 is suppressed, thus the fermi level of the n-type epitaxial film layer 2 does not fluctuate depending on the position but is maintained constant in the inner portion of the n-type epitaxial film layer 2. Thus, the fluctuation in the threshold voltage is suppressed.

The insulating film 4 and the defect layer 8 according to the present embodiment are described. There is a large amount of defect of atom arrangement caused by the hole, for example, in the defect layer 8 compared with part of the n-type epitaxial film layer 2 other than the defect layer 8. The diffusion of the impurity via the defect is caused in the inner side of the defect layer 8, thus a diffusion speed of the impurity is larger in the defect layer 8 than in the part of the inner portion of the n-type epitaxial film layer 2 other than the defect layer 8.

The impurity is readily diffused into the inner portion of the n-type epitaxial film layer 2 in the inner portion of the defect layer 8. Furthermore, atoms in the p-type thin film layer 3 diffused into the inner portion of the n-type epitaxial film layer 2 form an electrical charge, and the electrical charge fluctuates the fermi level of the n-type epitaxial film layer 2, and causes the fluctuation of the threshold voltage.

As described above, the insulating film 4 formed on the surface of the defect layer 8 inactivates the defect layer 8, and serves as a barrier layer preventing the diffusion of the atoms contained in the p-type thin film layer 3. The diffusion of the impurity from the p-type thin film layer 3 into the n-type epitaxial film layer 2 is suppressed.

The diffusion of the impurity is suppressed, thus the fermi level of the n-type epitaxial film layer 2 is maintained constant, and the fluctuation in the threshold voltage is suppressed. Herein, the insulating film 4 needs not necessarily cover the whole side surface 511 as illustrated in FIGS. 6A and 6B, but the insulating film 4 serves as the barrier layer as long as part of the side surface 511 is covered by the insulating film 4, and have the effect of the present invention.

Herein, a configuration that the insulating film 4 covers part of the side surface 511 closer to the Schottky junction region 56 is preferable to a configuration that the insulating film 4 covers part of the side surface 511 closer to the concave portion 50 so that the insulating film 4 achieves the function as the barrier layer.

Next, a method of manufacturing the power semiconductor device 100a is described. Each of FIGS. 7A to 7G illustrates a state after each manufacturing process of the power semiconductor device 100a according to the embodiment 2. Described is a case of using gallium oxide and the p-type microcrystal film as the single crystal n-type semiconductor substrate 1 and the p-type thin film layer 3 in the manner similar to the power semiconductor device 100 in the embodiment 1.

Figure 7A:
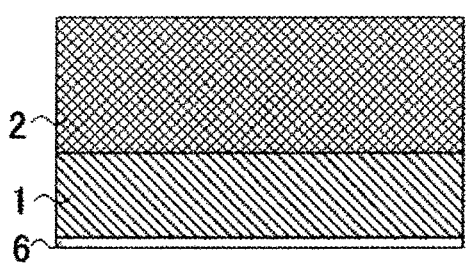
FIGS. 7A to 7G Diagrams illustrating a state after each manufacturing process of the power semiconductor device according to the embodiment 2 of the present invention.
Figure 7B:
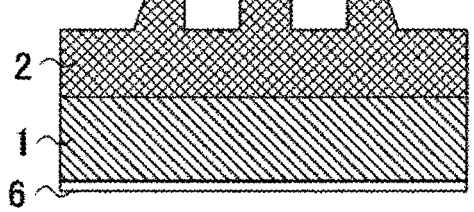
Figure 7C:
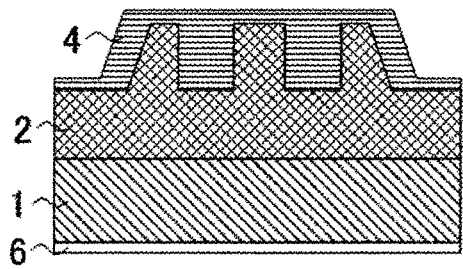

The detailed description is omitted in the description in FIGS. 7A to 7G overlapping with the description in FIGS. 5A to 5F in the embodiment 1. After the cathode electrode 6 is formed in FIG. 7A, the mesa structure and the convex-concave structure are formed in the n-type epitaxial film layer 2 as illustrated in FIG. 7B. Next, as illustrated in FIG. 7C, the insulating film 4 is formed on the whole upper surface of the n-type epitaxial film layer 2.

Figure 7D:
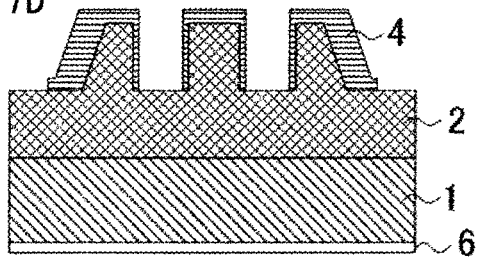

Next, as illustrated in FIG. 7D, the insulating film 4 in part of a region in the concave portion 50 in the n-type epitaxial film layer 2 is removed. After the insulating film 4 is removed, the insulating film 4 formed on the side surface 511 is made to remain. Furthermore, the insulating film 4 formed on the top portion 512 is made to remain, thus the diffusion of the impurity from the p-type thin film layer 3 into the region near the Schottky junction region 56 is suppressed.

Figure 7E:
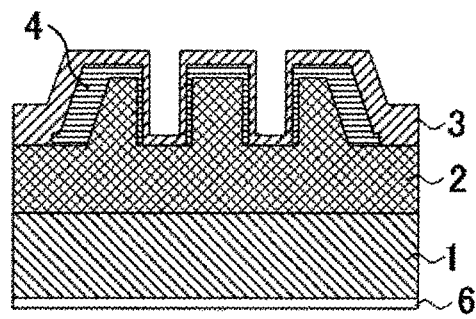

The insulating film 4 is preferably formed on the whole surface of the side surface 511, however, the effect of the present invention is achieved even when the insulating film 4 is formed within a range other than part near the concave portion 50 in the side surface 511. FIG. 7E illustrates a process of forming the p-type thin film layer 3, FIG. 7F illustrates a process of forming the opening part 515, and FIG. 7G illustrates a process of forming the anode electrode 5.

Figure 7F:
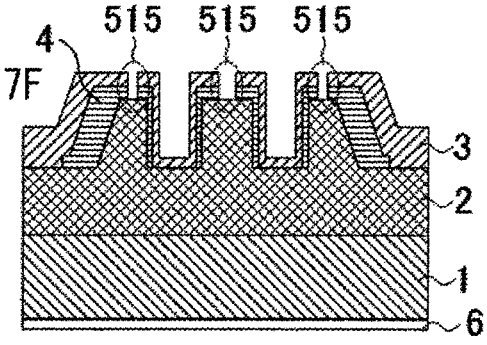
Figure 7G:
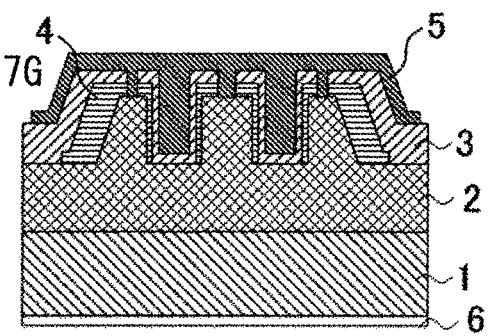

The processes in FIG. 7E, FIG. 7F, and FIG. 7G are the same as those in the description of FIGS. 5A to 5F in the embodiment 1, thus the detailed description is omitted.

As described above, the power semiconductor device 100a can provide the power semiconductor device in which the leakage current caused by the defect layer is reduced and the fluctuation in the threshold voltage is small. The power semiconductor device which reduces the leakage current and the fluctuation in the threshold voltage in both cases of the forward bias and the reverse bias can be provided.

Furthermore, the insulating film 4 is provided between the side surface 511 and the p-type thin film layer 3, thus the defect layer 8 is inactivated, and in addition, the insulating film 4 serves as the barrier layer, thus the diffusion of the impurity into the inner portion of the n-type epitaxial film layer 2 is suppressed, and the fluctuation in the threshold voltage is suppressed.

Embodiment 3

A power semiconductor device 100b according to an embodiment 3 is an SB diode (Schottky barrier diode) in which a pn junction is disposed as a guard ring around the Schottky junction region 56.

Figure 8A:
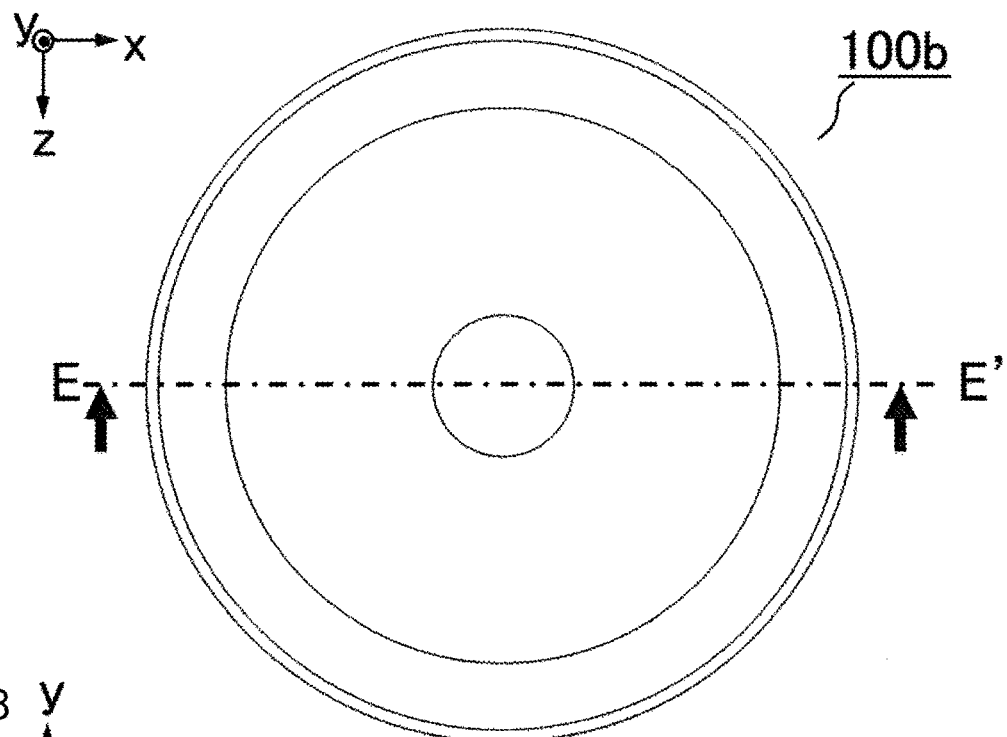
FIGS. 8A and 8B Configuration diagrams of a power semiconductor device according to an embodiment 3 of the present invention.
Figure 8B:
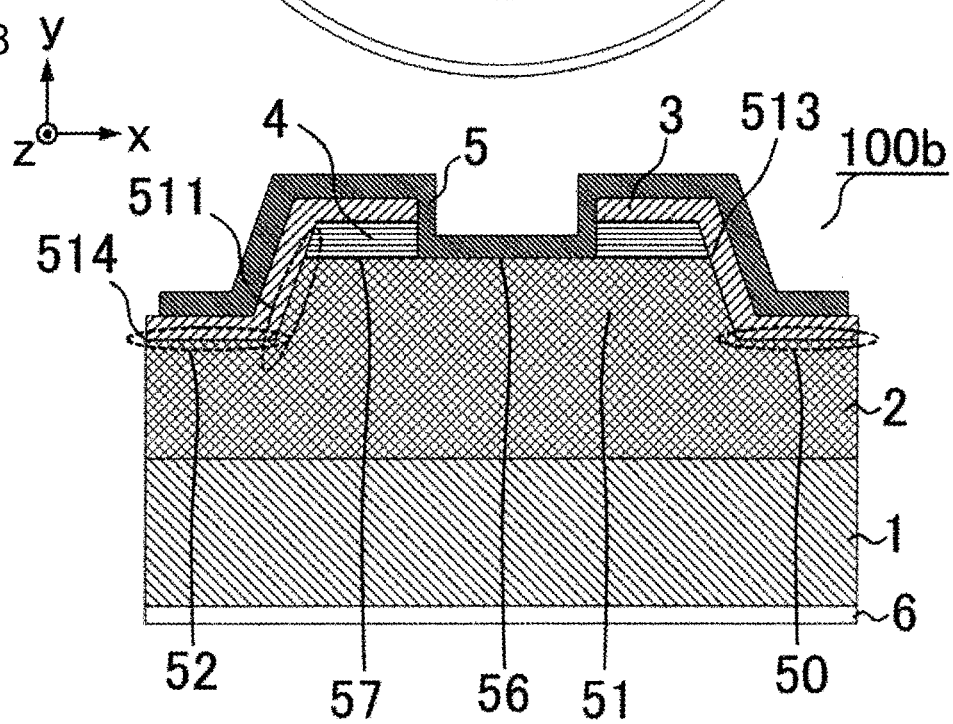

Each of FIGS. 8A and 8B is a configuration diagram of the power semiconductor device 100b according to the embodiment 3. An x axis, a y axis, and a z axis, which are coordinate axes of three-axis rectangular coordinate system are illustrated in FIG. 8A and FIG. 8B.

FIG. 8A is a planar view of the power semiconductor device 100b. FIG. 8B is a cross-sectional view of the power semiconductor device 100b illustrating a cross section at a surface EE' in FIG. 8A.

The power semiconductor device 100b is made up of the single crystal n-type semiconductor substrate 1. The cathode electrode 6 is formed on the lower surface of the single crystal n-type semiconductor substrate 1, and the n-type epitaxial film layer 2, the insulating layer 4, the p-type thin film layer 3, and the anode electrode 5 are formed in layers on the upper side of the single crystal n-type semiconductor substrate 1 in the manner similar to the power semiconductor device 100 in the embodiment 1.

The defect layer 8 is formed on the side surface 511 and the mesa bottom portion 52 in FIG. 8B due to the etching and the orientation of the crystal surface in the manner similar to the embodiment 1. Differing from the power semiconductor device 100 in the embodiment 1, the upper surface of the n-type epitaxial film layer 2 is made up only of the convex portion 51 and the mesa bottom portion 52, and only the mesa bottom portion 52 is formed as the concave portion 50 and the groove portion is not formed.

That is to say, as illustrated in FIG. 8B, the convex portion 51 having the island shape and the mesa bottom portion 52 disposed between the convex portion 51 having the island shape and the outer edge 514 are formed on the upper surface of the n-type epitaxial film layer 2. The same reference numerals are assigned to the same constituent elements as those illustrated in FIGS. 1A to 1C in the embodiment 1, and the detailed description is omitted.

In FIG. 8B, the pn junction is formed in the side surface 511, the anode electrode 5 passes through the p-type thin film layer 3 and the insulating film 4 to extend in the negative direction of the y axis, and the extended portion reaches the top portion 512. The insulating region 57 is disposed to separate the Schottky junction region 56 and the edge portion 513.

Thus, the power semiconductor device 100b can provide the power semiconductor device which suppresses the leakage current caused by the defect layer and has the small fluctuation in the threshold voltage in the manner similar to the power semiconductor device 100 in the embodiment 1. The power semiconductor device which has the small fluctuation in the threshold voltage in both cases of the forward bias and the reverse bias can be provided.

The groove portion is not provided in the power semiconductor device 100b, thus the area of the Schottky junction region 56 which is an area contributing to a power distribution (an area in the surface xz) can be increased compared with the power semiconductor device 100 on an assumption that an outline size is the same.

Thus, the power semiconductor device having the small resistance to enable the large current to flow and having fluctuation in the threshold voltage can be provided.

The power semiconductor device 100b can also suppress the diffusion of the impurity from the p-type thin film layer 3 into the n-type epitaxial film layer 2 when the insulating film 4 is formed on the side surface 511 as is the case in the power semiconductor device 100a in the embodiment 2.

A method of manufacturing the power semiconductor device 100b is described next. Each of FIGS. 9A to 9F illustrates a state after each manufacturing process of the power semiconductor device 100b according to the embodiment 3.

Figure 9A:
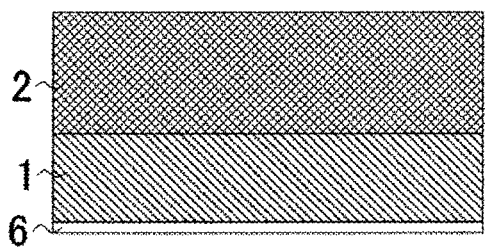
FIGS. 9A to 9F Diagrams illustrating a state after each manufacturing process of the power semiconductor device according to the embodiment 3 of the present invention.
Figure 9B:
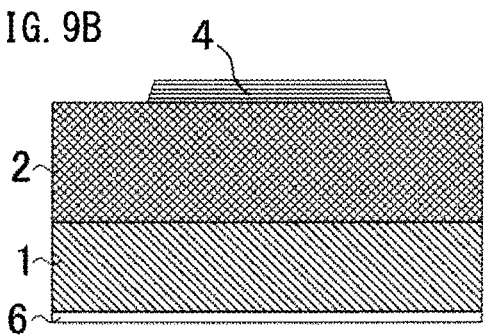

Gallium oxide and the p-type microcrystal film which is the p-type oxide semiconductor are used as the single crystal n-type semiconductor substrate 1 and the p-type thin film layer 3 in the manner similar to the power semiconductor device 100 in the embodiment 1. As illustrated in FIG. 9A, the cathode electrode 6 and the n-type epitaxial film layer 2 are formed, and as illustrated in FIG. 9B, the insulating film 4 is formed on the upper surface of the n-type epitaxial film layer 2.

Figure 9C:
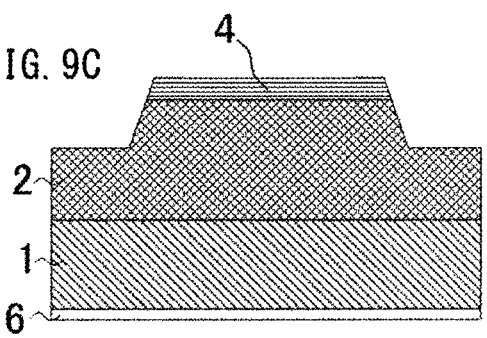
Figure 9D:
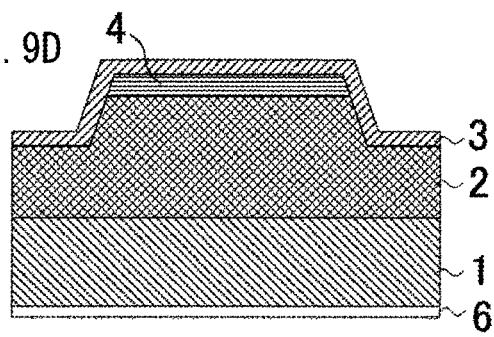
Figure 9E:
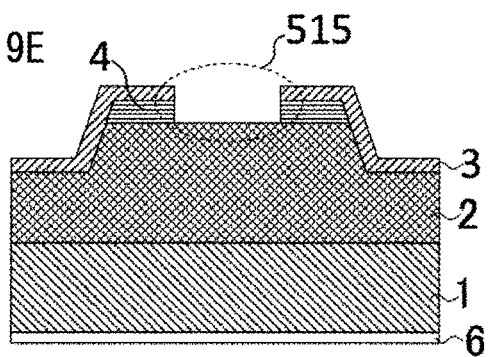
Figure 9F:
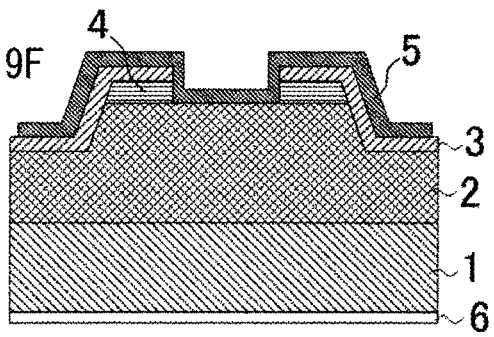

Next, as illustrated in FIG. 9C, etching is performed using the insulating film 4 as a mask to form the mesa structure in the n-type epitaxial film layer 2. FIG. 9D illustrates a process of forming the p-type thin film layer 3, and FIG. 9F illustrates a process of forming the opening part 515. The processes in FIG. 9D and FIG. 9F are similar to those in the embodiment 1, thus the detailed description is omitted. Described above is the process of manufacturing the power semiconductor device 100b.

As described above, according to the present embodiment, the power semiconductor device which suppresses the leakage current caused by the defect layer and has the small fluctuation in the threshold voltage can be provided. The power semiconductor device which has the small fluctuation in the threshold voltage in both cases of the forward bias and the reverse bias can be provided.

Furthermore, the power semiconductor device having the small resistance to enable the large current to flow and having fluctuation in the threshold voltage can be provided.

Embodiment 4

A power semiconductor device 100c according to an embodiment 4 is an SB diode (Schottky barrier diode) as is the case in the power semiconductor device 100b. In the power semiconductor device 100b, the insulating region 57 is disposed around the Schottky junction region 56, and the pn junction is disposed around the insulating region 57.

In the meanwhile, in the power semiconductor device 100c, the pn junction is formed around the Schottky junction region 56. The pn junction serves as a guard ring enlarging the depletion layer to a side of the Schottky electrode and outside to reduce the electrical field in the end portion of the Schottky electrode and the Schottky junction interface. When the insulating region 57 is formed around the pn junction and a field plate structure is formed via the insulating film 4, the depletion layer is further enlarged, thereby reducing the electrical field in the end portion of the Schottky electrode and improving a withstand voltage of the power semiconductor device 100c. Each of FIGS. 10A to 10C is a configuration diagram of the power semiconductor device 100b according to the embodiment 4.

Figure 10A:
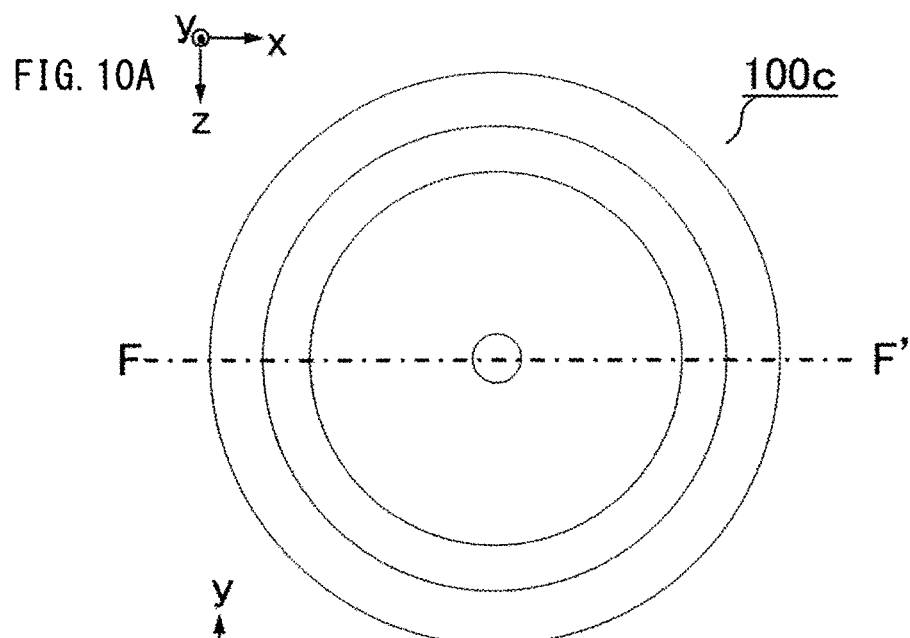
FIGS. 10A to 10C Configuration diagrams of a power semiconductor device according to an embodiment 4 of the present invention.

FIG. 10A is a planar view of the power semiconductor device 100c. FIG. 10B and FIG. 10C are cross-sectional views of the power semiconductor device 100c each illustrating a cross section at a surface FF' in FIG. 10A. An x axis, a y axis, and a z axis, which are coordinate axes of three-axis rectangular coordinate system are illustrated in FIG. 10A, FIG. 10B, and FIG. 10C.

Figure 10B:
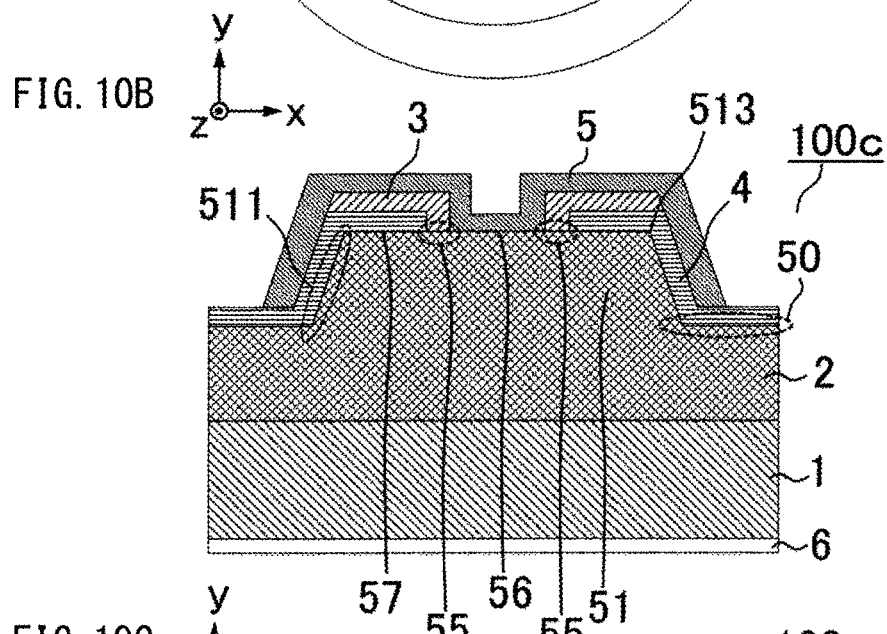
Figure 10C:
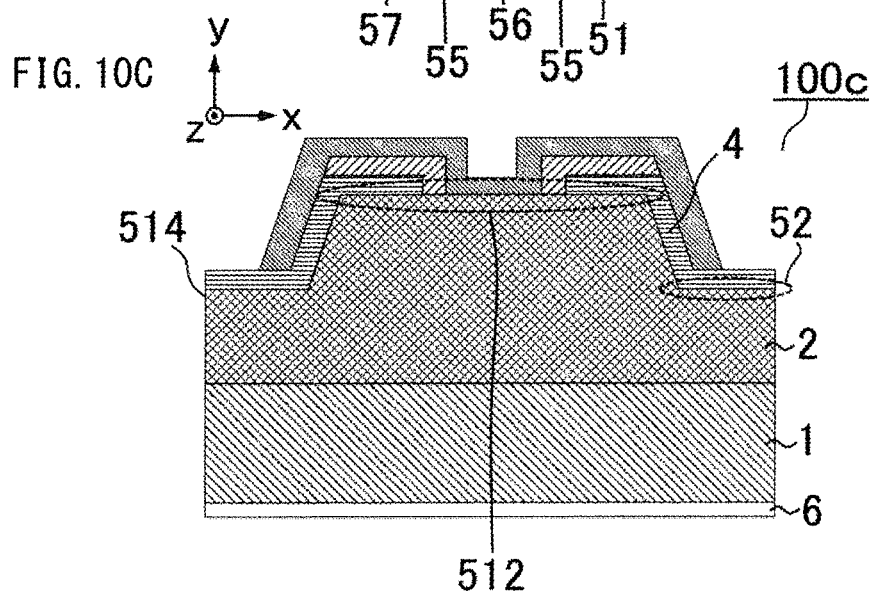

FIG. 10B and FIG. 10C are illustrated to simply indicate the reference numerals and lead lines. Some of the reference numerals and the lead lines are indicated in only one of FIG. 10B and FIG. 10C, and are omitted in the other one thereof. The same reference numerals are assigned to the same constituent elements or the corresponding constituent elements as those illustrated in FIGS. 1A to 1C in the embodiment 1.

The power semiconductor device 100c is made up of the single crystal n-type semiconductor substrate 1. The cathode electrode 6 is formed on the lower surface of the single crystal n-type semiconductor substrate 1, and the n-type epitaxial film layer 2 is formed on the upper side of the single crystal n-type semiconductor substrate 1 in the manner similar to the power semiconductor device 100 in the embodiment 1. The n-type epitaxial film layer 2 includes the concave portion 50 and the convex portion 51.

The insulating film 4 is formed on part of the top portion 512 of the convex portion 51 in the manner similar to the power semiconductor device 100. Part of the n-type epitaxial film layer 2 where the insulating film 4 is formed is referred to as the insulating region 57. The p-type thin film layer 3 is formed on the surface of the insulating film 4 and the surface of the n-type epitaxial film layer 2, and forms the pn junction between the p-type thin film layer 3 and the n-type epitaxial film layer 2. The region in the n-type epitaxial film layer 2 where the pn junction is formed between the n-type epitaxial film layer 2 and the p-type thin film layer 3 is referred to as the pn junction region 55 as is the case in the embodiment 1.

The anode electrode 5 is formed on each upper surface of the n-type epitaxial film layer 2, the p-type thin film layer 3, and the insulating film 4. Part of the anode electrode 5 passes through the p-type thin film layer 3 and the insulating film 4, and forms the Schottky junction between the anode electrode 5 and the n-type epitaxial film layer 2 in the Schottky junction region 56. The pn junction region 55 is located between the Schottky junction region 56 and the insulating region 57, and the pn junction region 55 is disposed to separate the Schottky junction region 56 and the insulating region 57.

The defect layer 8 is formed on the side surface 511 and the mesa bottom portion 52 in FIG. 10B and FIG. 10C due to a state where etching is performed in the manufacturing process and the crystal plane direction in part of the surface of the n-type epitaxial film layer 2 not parallel to the surface xz is a direction in which the defect readily occurs when the n-type epitaxial film layer 2 is bonded to the other material, for example, in the manner similar to the power semiconductor device 100 in the embodiment 1. Differing from the power semiconductor device 100 in the embodiment 1, the upper surface of the n-type epitaxial film layer 2 is made up only of the convex portion 51 and the mesa bottom portion 52, and the groove portion is not included in the power semiconductor device 100c.

That is to say, as illustrated in FIG. 10B and FIG. 10C, the convex portion 51 having the island shape is formed on the upper surface of the n-type epitaxial film layer 2, and the mesa bottom portion 52 is formed between the convex portion 51 and the outer edge 514. In FIG. 10B, the insulating film 4 is formed on the side surface 511 and the mesa bottom portion 52. Furthermore, the p-type thin film layer 3 and the insulating film 4 are formed on the top portion 512 of the convex portion 51.

The anode electrode 5 is formed on each upper surface of the n-type epitaxial film layer 2, the insulating film 4, and the p-type thin film layer 3. Part of the anode electrode 5 passes through the p-type thin film layer 3 and the insulating film 4, extends in the negative direction of the y axis from the upper surface of the p-type thin film layer 3, and reaches the top portion 512 of the n-type epitaxial film layer 2. The Schottky junction region 56 is formed in a junction part between the anode electrode 5 and the n-type epitaxial film layer 2.

The pn junction region 55 which is a junction part between the p-type thin film layer 3 and the n-type epitaxial film layer 2 is formed around the Schottky junction region 56 in the surface xz. The insulating region 57 is formed to separate the Schottky junction region 56 and the edge portion 513. The anode electrode 5 is formed on the upper surface of the insulating film 4 on part of the upper surface of the side surface 511 and part of the upper surface of the mesa bottom portion 52.

The part of the anode electrode 5 on the upper surface of the insulating film 4 formed on the side surface 511 and the mesa bottom portion 52 serves as a field plate. That is to say, this part of the anode electrode 5 draws electrons, which are in the inner portion of the n-type epitaxial film layer 2 to be carriers, to a side of the insulating film 4, and contributes to the enlargement of the depletion layer in the inner portion of the n-type epitaxial film layer 2 at the time of the reverse bias. The depletion layer spreads from the Schottky junction region 56 to the side surface 511 and further to the mesa bottom portion 52. As a result, the field intensity in the Schottky junction region 56 can be reduced.

The insulating region 57 is formed to separate the Schottky junction region 56 and the edge portion 513, thus the leakage current caused by the defect layer 8 formed on the side surface 511 can be reduced. Thus, the power semiconductor device 100c can provide the power semiconductor device which suppresses the leakage current caused by the defect layer 8 and has the small fluctuation in the threshold voltage in the manner similar to the power semiconductor device 100 in the embodiment 1. The power semiconductor device which reduces the fluctuation in the threshold voltage in both cases of the forward bias and the reverse bias can be provided.

The pn junction region 55 is located adjacent to the Schottky junction region 56, thus the depletion layer is enlarged in the reverse bias. In the forward bias in the low voltage, the insulating film 4 and the p-type thin film layer 3 have the effect of suppressing the spread of the electrical field in the inner portion of the n-type epitaxial film layer 2 into the side surface 511 and reducing the leakage current caused by the defect layer 8 formed on the side surface 511. The pn junction described above enhances this effect, thus has the effect of further reducing the leakage current.

A process of manufacturing the power semiconductor device 100c is described next. Each of FIGS. 11A to 11F illustrates a state after each manufacturing process of the power semiconductor device 100c according to the embodiment 4. FIG. 11A to 11F do not illustrate a coordinate system, however, the manufacturing process is described on an assumption that coordinate axes each having the same direction as the coordinate axes in FIG. 10B are illustrated in FIG. 11A to FIG. 11F.

Gallium oxide and the p-type microcrystal film are used as the single crystal n-type semiconductor substrate 1 and the p-type thin film layer 3, respectively, in the manner similar to the power semiconductor device 100b in the embodiment 3. The p-type microcrystal film is the p-type oxide semiconductor. As illustrated in FIG. 11A, the cathode electrode 6 and the n-type epitaxial film layer 2 are formed on the lower side and the upper side of the single crystal n-type semiconductor substrate 1, respectively. Then, as illustrated in FIG. 11B, the insulating film 4 is formed on the upper surface of the n-type epitaxial film layer 2.

Next, as illustrated in FIG. 11C, formed is an opening part 516 passing through the insulating film 4 to reach the n-type epitaxial film layer 2 from part of the upper surface of the insulating film 4 formed on the convex portion 51. Moreover, as illustrated in FIG. 11D, the p-type thin film layer 3 is formed on the whole opening part 516 and upper surface of the insulating film 4. Furthermore, as illustrated in FIG. 11E, an opening part 517 having a depth to reach the n-type epitaxial film layer 2 is formed in the p-type thin film layer 3 formed on the convex portion 51. In the surface xz, the opening part 517 is included in the opening part 516. That is to say, the opening part 517 is formed so that the whole opening part 517 is located inside the opening part 516 when seen from the y axis direction. The p-type thin film layer 3 formed on the mesa bottom portion 52 and the side surface 511 is removed at the same time.

Furthermore, as illustrated in FIG. 11F, the anode electrode 5 is formed on the upper surface of the insulating film 4 where the opening part 517 is formed and the upper surface of the n-type epitaxial film layer 2. The process of forming the anode electrode 5 is similar to that in the embodiment 1, thus the detailed description is omitted. Described above is the process of manufacturing the power semiconductor device 100c.

As described above, according to the present embodiment, the power semiconductor device which suppresses the leakage current caused by the defect layer and has the small fluctuation in the threshold voltage can be provided also in the configuration adopting the field plate structure. The power semiconductor device having the small fluctuation in the threshold voltage in both cases of the forward bias and the reverse bias can be provided.

The embodiments described above can be applied in combination.

EXPLANATION OF REFERENCE SIGNS 1 single crystal n-type semiconductor substrate, 2 n-type epitaxial film layer, 3 p-type thin film layer, 4 insulating film, 5 anode electrode, 6 cathode electrode, 50 concave portion, 51 convex portion, 56 Schottky junction region, 57 insulating region, 100, 100a, 100b, power semiconductor device, 511 side surface, 512 top portion, 513 edge portion, 514 outer edge.

The invention claimed is:

1. A power semiconductor device, comprising:
a single crystal n-type semiconductor substrate;
an n-type epitaxial film layer formed on a surface of the single crystal n-type semiconductor substrate and having a concave portion and a convex portion;
a cathode electrode formed on a surface on an opposite side of the surface of the single crystal n-type semiconductor substrate;
an insulating film formed on a first region in a top portion of the convex portion;
a p-type thin film layer formed on a surface of the insulating film and a surface of the n-type epitaxial film layer to form a pn junction between the p-type thin film layer and the n-type epitaxial film layer; and
an anode electrode, at least part of which is formed on a surface of the p-type thin film layer and part of which passes through the p-type thin film layer and the insulating film to form a Schottky junction between the anode electrode and the n-type epitaxial film layer on the top portion of the convex portion in a second region separated from an edge portion of the top portion by the first region.

2. The power semiconductor device according to claim 1, wherein
a first convex portion having m island shape is formed on the surface of the n-type epitaxial film layer and the concave portion is formed on the surface of the n-type epitaxial film layer between the first convex portion and an outer edge of the n-type epitaxial film layer.

3. The power semiconductor device according claim 1, wherein
the top portion of the convex portion of the n-type epitaxial film layer is located above part of the anode electrode formed on the surface of the p-type thin film layer formed on a surface of the concave portion.

4. The power semiconductor device according to claim 1, wherein
the insulating film is formed in contact with a side surface of the convex portion.

5. The power semiconductor device according to claim 1, wherein
the single crystal n-type semiconductor substrate and the n-type epitaxial film layer are formed of an identical material.

6. The power semiconductor device according to claim 1, wherein
a hetero junction is formed between the p-type thin film layer and the n-type epitaxial film layer, and the hetero junction is formed around the Schottky junction on an upper surface of the n-type epitaxial film layer.

7. The power semiconductor device according to claim 1, wherein
the n-type epitaxial film layer is made of gallium oxide.

8. The power semiconductor device according to claim 7, wherein
the p-type thin film layer contains one of copper I oxide, silver I oxide, nickel oxide, and tin I oxide, or contains one of copper I oxide, silver I oxide, nickel oxide, and tin I oxide as a main component having a highest composition ratio and further contains another material having a smaller composition ratio than the main component.

9. The power semiconductor device according to claim 1, wherein
the p-type thin film layer is in a microcrystal state or an amorphous state.

10. The power semiconductor device according to claim 1, wherein
a difference of diffusion potential between the p-type thin film layer and the n-type epitaxial film layer is larger than a difference between a work function of the anode electrode and a fermi level of the n-type epitaxial film layer.

11. The power semiconductor device according to claim 1, wherein
the diffusion potential between the p-type thin film layer and the n-type epitaxial film layer is larger than 1.5 eV.

12. The power semiconductor device according to claim 1, wherein
the p-type thin film layer is formed on the surface of the insulating film and a bottom portion of the concave portion and a side surface of the convex portion of the n-type epitaxial film layer to form the pn junction between the p-type thin film layer and the n-type epitaxial film layer.

13. The power semiconductor device according to claim 1, wherein the Schottky junction between the anode electrode and the n-type epitaxial film layer on the top portion of the convex portion in a second region is surrounded and separated from the edge portion of the top portion by the insulating film of the first region.

14. A power semiconductor device, comprising:
a single crystal n-type semiconductor substrate;
an n-type epitaxial film layer formed on a surface of the single crystal n-type semiconductor substrate and having a concave portion and a convex portion;
a cathode electrode formed on a surface on an opposite side of the surface of the single crystal n-type semiconductor substrate;
an insulating film formed on a first region in a top portion of the convex portion;
a p-type thin film layer formed on a surface of the insulating film and a surface of the n-type epitaxial film layer to form a pn junction between the p-type thin film layer and the n-type epitaxial film layer; and
an anode electrode, at least part of which is formed on a surface of the p-type thin film layer and part of which passes through the p-type thin film layer and the insulating film to form a Schottky junction between the anode electrode and the n-type epitaxial film layer in a second region separated from an edge portion of the top portion by the first region,
wherein
a first convex portion having an island shape and one or a plurality of annular second convex portions surrounding the first convex portion are formed on the surface of the n-type epitaxial film layer, the concave portion is formed between the first convex portion and the second convex portion or between the second convex portion and the second convex portion, and the concave portion is formed between an outer periphery of the second convex portion located in a position closest to an outer edge of the n-type epitaxial film layer and the outer edge.

* * * * *